(12) United States Patent
Sasaki

(10) Patent No.: US 7,309,645 B2
(45) Date of Patent: Dec. 18, 2007

(54) SEMICONDUCTOR THIN FILM CRYSTALLIZATION METHOD

(75) Inventor: Nobuo Sasaki, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 266 days.

(21) Appl. No.: 11/093,845

(22) Filed: Mar. 30, 2005

(65) Prior Publication Data

US 2005/0167663 A1    Aug. 4, 2005

Related U.S. Application Data

(63) Continuation of application No. PCT/JP03/05979, filed on May 14, 2003.

(51) Int. Cl.
*H01L 21/208* (2006.01)

(52) U.S. Cl. .............................. 438/487; 257/E21.134

(58) Field of Classification Search ................ 438/487, 438/308
See application file for complete search history.

(56) References Cited

U.S. PATENT DOCUMENTS

| 4,545,823 | A |   | 10/1985 | Drowley |
| 4,822,752 | A |   | 4/1989 | Sugahara et al. |
| 4,861,418 | A | * | 8/1989 | Nishimura et al. ........... 117/44 |
| 5,336,918 | A | * | 8/1994 | Ipposhi et al. .............. 257/419 |
| 5,371,381 | A |   | 12/1994 | Sugahara et al. |
| 6,872,977 | B2 | * | 3/2005 | Hatano et al. ................. 257/64 |
| 2002/0031876 | A1 |   | 3/2002 | Hara et al. |
| 2003/0042486 | A1 |   | 3/2003 | Sano et al. |

FOREIGN PATENT DOCUMENTS

| EP | 0 235 819 | 9/1987 |
| JP | 2003-86505 | 3/2003 |

(Continued)

OTHER PUBLICATIONS

Sasaki et al.; "A new Low-Temperature Poly-Si TFT Technology Realizing Mobility Above 500 $cm^2$/Vs by Using CW Laser Lateral Crystallization (CLC)"; The Transactions of the Institute of Electronics, Information and Communication Engineers: vol. J85-C, No. 8, pp. 601-608; 2002.

(Continued)

*Primary Examiner*—Michael Lebentritt
*Assistant Examiner*—Jennifer M Dolan
(74) *Attorney, Agent, or Firm*—Greer, Burns & Crain, Ltd.

(57) ABSTRACT

The semiconductor thin film crystallization method comprises the step of forming a semiconductor thin film 14 over a substrate 10; the step of forming band-shaped portion 16 for blocking crystal growth of the semiconductor thin film in the semiconductor film or over the semiconductor film; and the step of causing an energy beam 18 of a continuous wave to scan in a direction intersecting the longitudinal direction of the portion for blocking crystal growth. The energy beam is caused to scan, intersecting the portion for blocking the crystal growth, whereby the crystal growth can be interrupted when the application region of the energy beam intersects the portions for blocking the crystal growth. Even when a solid semiconductor thin film which is not patterned in islands is crystallized, the semiconductor thin film of good crystals can be formed with high yields while the film is prevented from peeling.

22 Claims, 25 Drawing Sheets

FOREIGN PATENT DOCUMENTS

JP 2003-86509 3/2003

OTHER PUBLICATIONS

Hara et al.; "Selective Single-Crystalline-Silicon Growth at the Pre-defined Active Regions of TFTs on a Glass by a Scanning CW Laser Irradiation"; IEEE IEDM 2000 Tech. Digest, pp. 209-212; 2000.

Hara et al.; "High Performance Poly-Si TFTs on a Glass by a Stable Scanning CW Laser Lateral Crystallization"; IEEE IEDM 2001 Tech. Digest, pp. 747-750; 2001.

Sano et al.; "High-Performance Single-Crystalline-Silicon TFTs on a Non-Alkali Glass Substrate"; IEEE IEDM 2002 Tech. Digest. pp. 565-568; 2002.

Yoshino et al.; "Effect on Poly-Si Film Uniformity and TFT Perormance of Overlap Irradiation by a Stable Scanning CW Laser"; Proc. 9th Intl. Display Workshops 2002; pp. 343-346; Dec. 4-5, 2002.

* cited by examiner

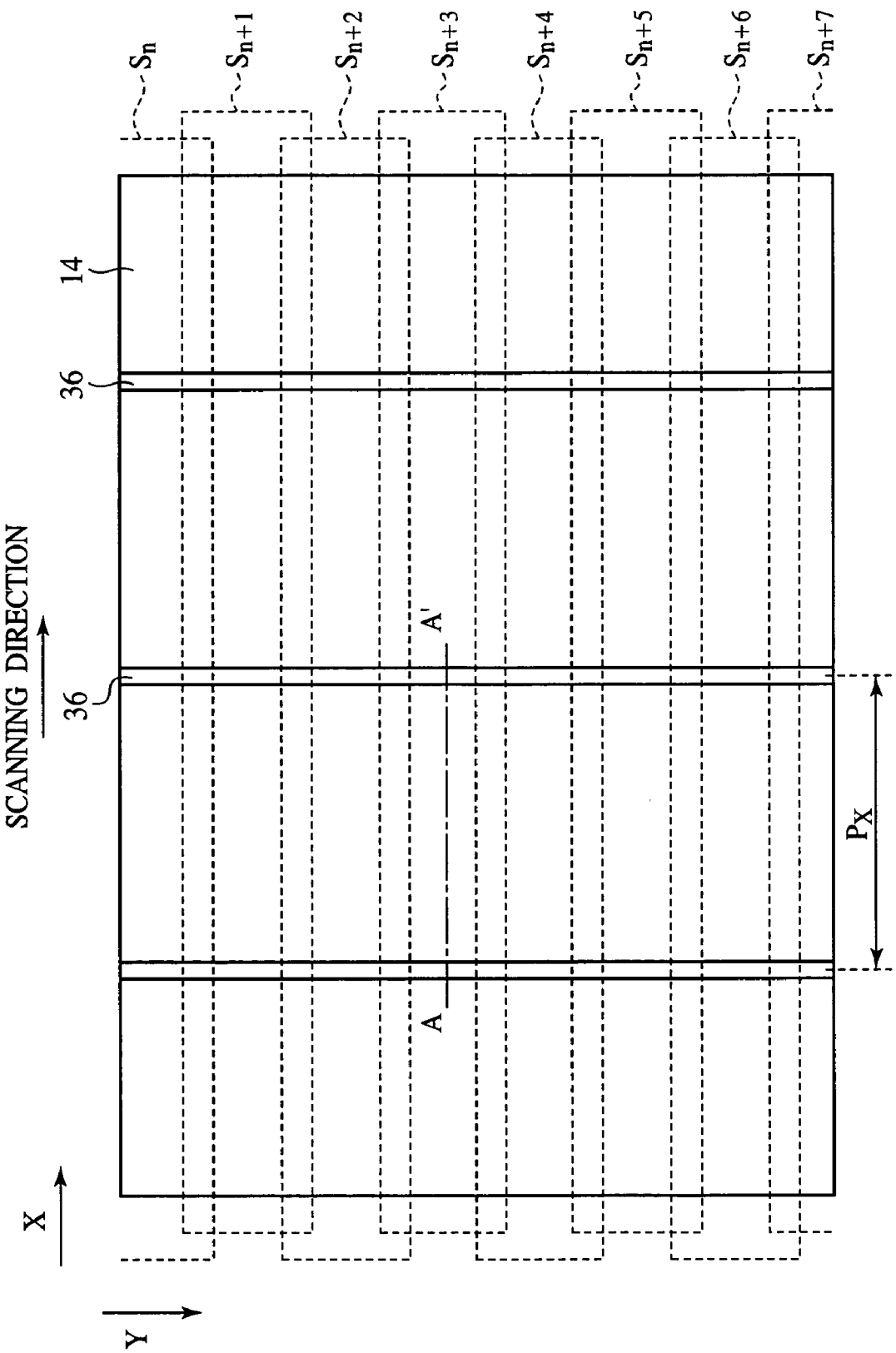

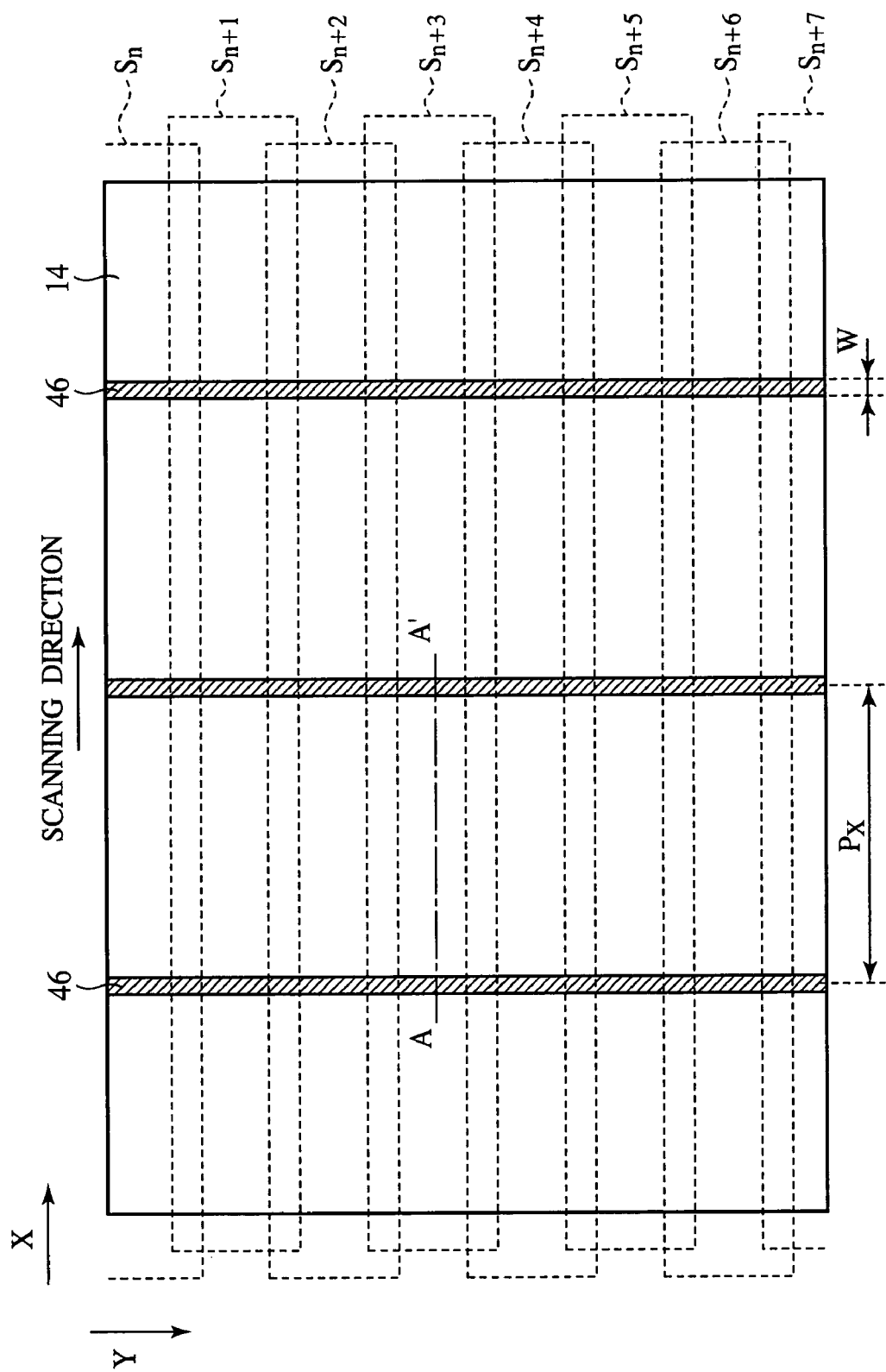

SEMICONDUCTOR THIN FILM CRYSTALLIZATION METHOD

CROSS REFERENCE TO RELATED APPLICATION

This application is a Continuation of International Application No. PCT/JP03/05979, with an international filing date of May 14, 2003, which designated the United States of America.

TECHNICAL FIELD

The present invention relates to a semiconductor thin film crystallization method, more specifically a semiconductor thin film crystallization method which can form semiconductor thin film of good crystals with high yields without patterning in islands.

BACKGROUND ART

Recently, techniques of forming polycrystalline silicon film at relatively low temperatures are proposed. These techniques can form polycrystalline silicon film on glass substrates of relatively low heat resistance, and thin film transistors (TFT) using polycrystalline silicon film as the active semiconductor film can be formed on a glass substrate.

Thin film transistors using polycrystalline silicon film are usable as switching elements for the pixels of active matrix liquid displays (LCD).

Thin film transistors using polycrystalline silicon film as the active semiconductor films have higher carrier mobility than thin film transistors using amorphous silicon film as the active semiconductor films, and can realize high speed operation. Thus, thin film transistors using polycrystalline silicon film are usable as the switching elements for pixels, but also as the switching elements for peripheral circuits. Accordingly, the technique which can form polycrystalline silicon film at relatively low temperatures can provide a system on panel having the display and the peripheral circuits formed on one and the same substrate.

Thin film transistors using polycrystalline silicon film as the active semiconductor films are expected to be used in liquid crystal displays, but also in organic ELs (ElectroLuminescence) displays.

As a technique which can form polycrystalline silicon film on a glass substrate at relatively low temperatures, the following technique, for example, is proposed.

First, an amorphous silicon film is formed on a glass substrate.

Next, pulsated laser beams are applied to the amorphous silicon film. The laser beams are, e.g., excimer laser beams.

When pulsated laser beams are applied, the silicon melted by the laser beams grows into crystal during solidification, and polycrystalline silicon film is formed.

However, the polycrystalline silicon film formed by the above-described technique does not have sufficiently large grain diameter of the silicon crystal. Accordingly, the carrier mobility cannot be sufficiently high.

As a technique for obtaining higher carrier mobility, the following technique is proposed.

First, an amorphous silicon film is formed on a glass substrate.

Next, the glass substrate is placed on an X-Y stage.

Next, with laser beams of continuous waves being applied to the amorphous silicon film, the glass substrate is displaced by the X-Y stage for the laser beams to scan glass substrate. The laser beams are laser beams of semiconductor excitation.

When the laser beams scan, the amorphous silicon film is melted in a region where the laser beams are being applied, and in a region where the laser beams have been applied, the silicon goes on solidifying. The crystallization of the silicon goes on in the scanning direction of the laser beams, and elongated crystal grows along the scanning direction of the laser beams. Such manner of the crystal growth is called lateral growth.

The thus crystallized silicon thin film is used as an active semiconductor film with the longitudinal direction of the silicon crystals agreed with a direction of carrier transfer, whereby a thin film transistor of very high carrier mobility can be fabricated. When the carriers are transferred in the longitudinal direction of the silicon crystals, the transfer of the carriers is not blocked by the crystal grain boundaries.

However, in crystallizing all of the solidly formed amorphous silicon film by this proposed technique, the film often peels. FIG. 23 is a view illustrating peeling of the film. As illustrated in FIG. 23, film peeling 102 takes place at a part of the crystallized silicon thin film 100. The peeling 102 of the crystallized film does not take place easily at the point where the scanning of the laser beams started and more tends to take place farther away from the point where the scanning of the laser beams started. The film peeling 102 is continued as the scan of the laser beams goes on, and the film peels over a wide area. Accordingly, the silicon thin film 110 having the film peeling 102 is unusable in products. The cause for the film peeling 102 is not clear but will be due to impurities contained in the film, the surface tension of the melted silicon, etc.

As a technique which can prevent the film peeling 102 is proposed a technique that amorphous silicon film is patterned in islands in advance, and laser beams scan the amorphous silicon film patterned in the islands (see Patent References 1 and 2).

FIG. 24A illustrates an example of the arrangement of 60 µm×70 µm rectangular island patterns 104. FIG. 24B illustrates an example of the arrangement of 50 µm×200 µm island patterns 104b. The island patterns 104b have semi-circular ends. The shape and the dimensions of the island patterns are not limited the above and are suitably set.

The amorphous silicon film are patterned in islands in advance, whereby the laser beams scan the island patterns 104a, 104b one by one over a relatively small distance, and the film does not easily peel. Even when the film peels in one island pattern 104a, 104b, the island patterns 104a, 104b where the film has peeled are isolated from the rest island patterns 104a, 104b, and the peeling of the film is never taken over the rest island patterns 104a, 104b.

The amorphous silicon film is thus patterned in island in advance, whereby the yield can be improved.

However, when the amorphous silicon film patterned in islands is crystallized, good crystals do not grow at an edge part 106 of the island pattern 104. The part which is suitable for the active semiconductor film of thin film transistors is limited to a central part 108 of the island pattern 104 (see FIG. 25A).

Accordingly, as illustrated in FIG. 25B, the island pattern 104 is further patterned to use the central part 108 alone of the island pattern 104 as the active semiconductor film 110 of thin film transistors. Then, a gate insulation film (not illustrated) is formed on the active semiconductor film 110, and a gate electrode 112 is formed. Thus, a thin film transistor 114 is fabricated. Thus, only a part of the island pattern 104 can be used as the active semiconductor film 110 of the thin film transistor 114. Accordingly, the technique of patterning the amorphous silicon film in island in advance cannot form the thin film transistors 114 dense. A technique which can form a semiconductor thin film of good crystals with high yields without pattering the amorphous silicon film in island in advance has been expected.

Following references disclose the background art of the present invention.

[Patent Reference 1]

Specification of Japanese Patent Application Unexamined Publication No. 2003-86505

[Patent Reference 2]

Specification of Japanese Patent Application Unexamined Publication No. 2003-86509

[Non-Patent Reference 1]

Nobuo SASAKI, Akito HARA, Fumiyo TAKEUCHI, Katsuyuki SUGA, Michiko TAKEI, Kenichi YOSHINO, and Mitsuru CHIDA, "A New Low-Temperature Poly-Si TFT Technology Realizing Mobility above 500 $cm^2/V_s$ by Using CW Laser Lateral Crystallization (CLC)," The Transactions of the Institute of Electronics, Information and Communication Engineers C, Vol. J85-C No. 8, pp. 601-608 (2002).

[Non-Patent Reference 2]

A. Hara, F. Takeuchi, and N. Sasaki, "Selective Single-Crystalline-silicon Growth at the Pre-defined Active Regions of TFTs on a Glass by a Scanning CW Laser Irradiation," IEEE IEDM 2000 Tech. Digest, pp. 209-212 (2000).

[Non-Patent Reference 3]

A. Hara, Y. Mishima, T. Kakehi, F. Takeuchi, M. Takei, K. Yoshino, K. Suga, M. Chida, and N. Sasaki, "High performance Poly-Si TFTs on a Glass by a Stable Scanning CW Laser Lateral Crystallization," IEEE IEDM 2001 Tech. Digest, pp. 747-750 (2001).

[Non-Patent Reference 4]

Y. Sano, M. Takei, A. Hara, and N. Sasaki, "High-Performance Single-Crystalline-Silicon TFTs on a Non-Alkali Glass Substrate," IEEE IEDM 2002 Tech. Digest, pp. 565-568 (2002).

[Non-Patent Reference 5]

K. Yoshino, M. Takei, M. Chida, A. Hara, and N. Sasaki, "Effect on Poli-Si Film Uniformity and TFT Performance of Overlap Irradiation by a Stable Scanning CW Laser," Proc. 9th Int. Display Workshops '02 (Hiroshima, Dec. 4-6, 2002), pp. 343-346 (2002).

An object of the present invention is to provide a semiconductor thin film crystallization method which can form semiconductor thin film of good crystals with high yields without patterning in island in advance.

DISCLOSURE OF THE INVENTION

The above-described object is achieved by a semiconductor thin film crystallization method comprising the steps of: forming a semiconductor thin film over a substrate; forming a band-shaped portion for blocking crystal growth of the semiconductor thin film in the semiconductor film or over the semiconductor thin film; and crystallizing the semiconductor thin film by causing an energy beam of a continuous wave to scan in a direction intersecting the longitudinal direction of the portion for blocking crystal growth to thereby crystallize the semiconductor thin film.

According to the present invention, an energy beam scans, intersecting parts which block the crystal growth, whereby the crystal growth can be interrupted when the application region of the energy beam intersects the parts which block the crystal growth. When the length over which the crystal growth is taken over is set somewhat short, there is a tendency that the film does not easily peel, which permits the semiconductor thin film of good crystals to be formed while the film is prevented from peeling. Even when the film peels, the peeling of the film can be interrupted when the application region of the energy beam intersects the parts for blocking the crystal growth. Thus, according to the present invention, even when a solid semiconductor thin film is crystallized without being patterned in island, the semiconductor thin film of good crystals can be formed with high yields while the film is prevented from peeling. According to the present invention, a semiconductor thin film of good crystals can be formed solid, which allows thin film transistor of good electric characteristics to be fabricated in high density.

BRIEF DESCRIPTION OF THE DRAWINGS

FIG. 12 is a plan view illustrating the semiconductor thin film crystallization method according to the second embodiment of the present invention.

FIG. 17 is a plan view illustrating the semiconductor thin film crystallization method according to the fourth embodiment of the present invention.

BEST MODES FOR THE CARRYING OUT THE INVENTION

A FIRST EMBODIMENT

Figure 1A:
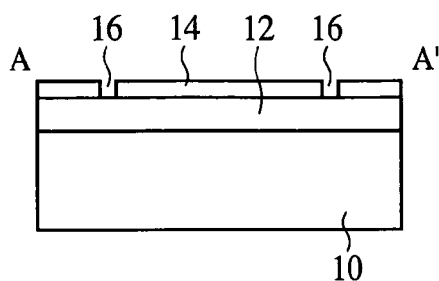
FIGS. 1A to 1F are sectional views and plan views illustrating a semiconductor thin film crystallization method according to a first embodiment of the present invention.
Figure 1B:
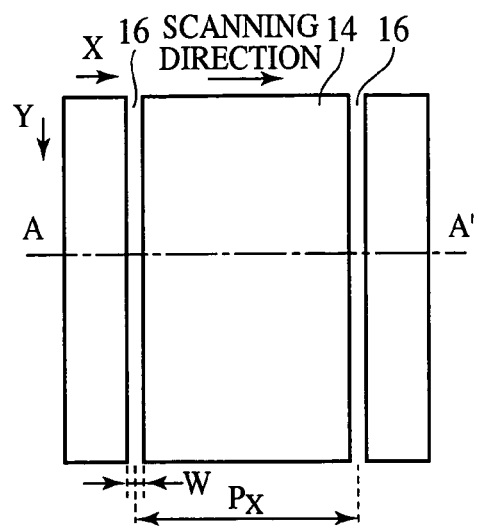
Figure 1C:
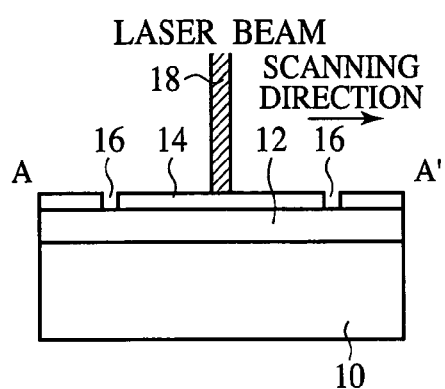
Figure 1D:
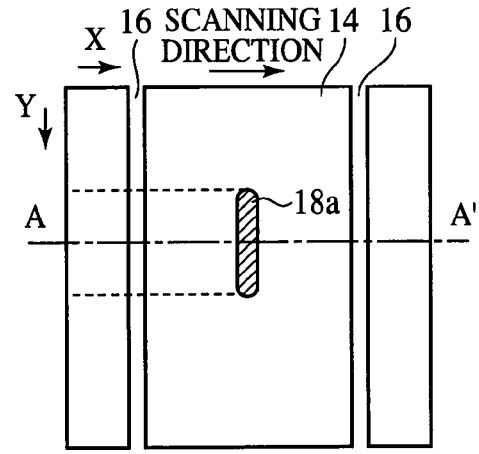
Figure 1E:
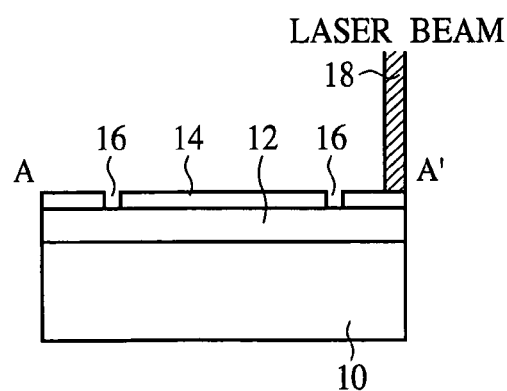
Figure 1F:
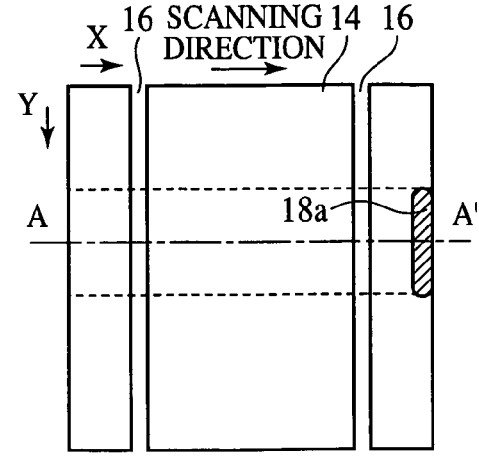
Figure 2:
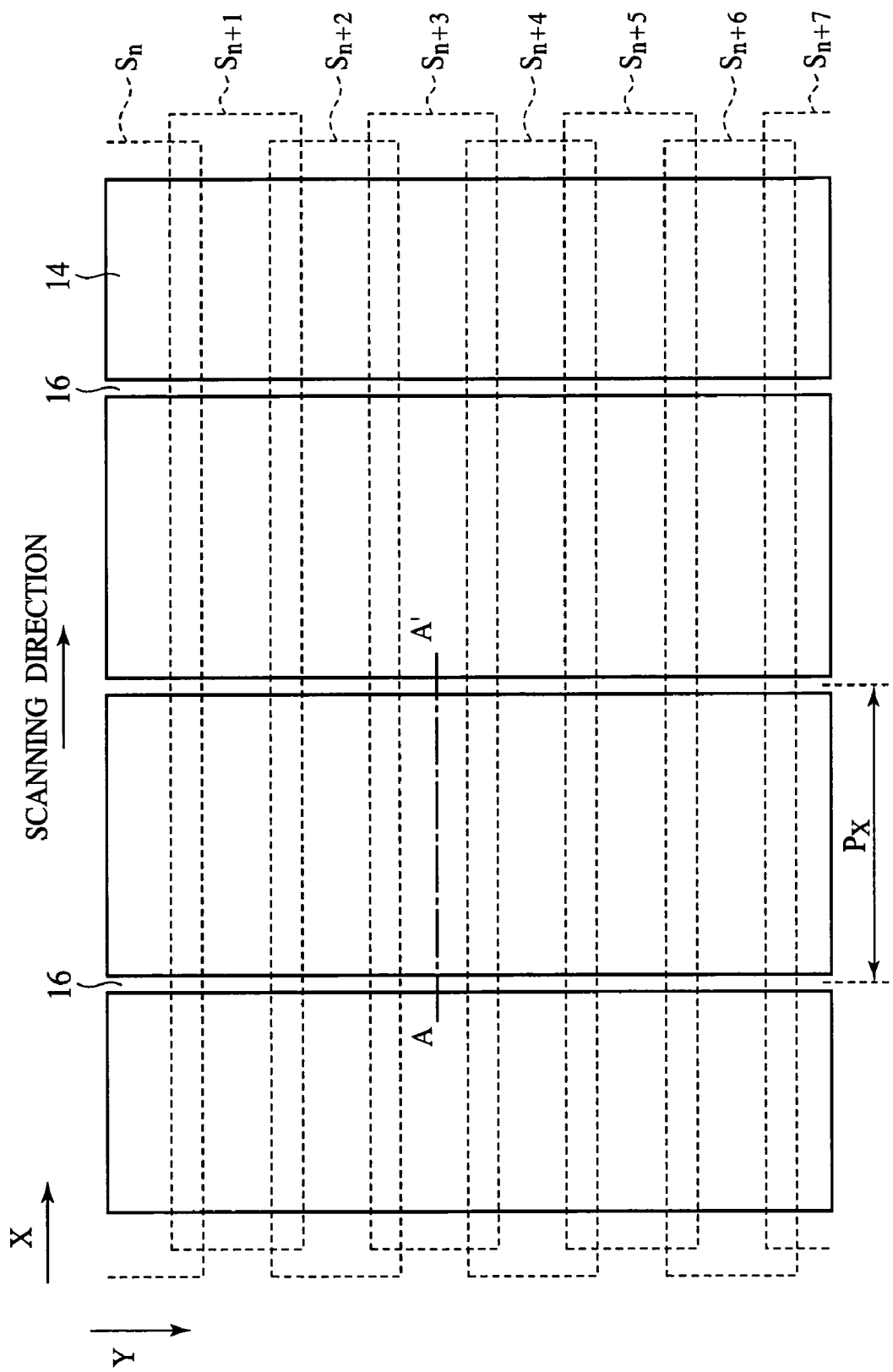
FIG. 2 is a plan view illustrating the semiconductor thin film crystallization method according to the first embodiment of the present invention.

The semiconductor thin film crystallization method according to a first embodiment of the present invention will be explained with reference to FIGS. 1A to 4B. FIGS. 1A to 1F are sectional views and plan views illustrating the semiconductor thin film crystallization method according to the present embodiment. FIGS. 1A, 1C and 1E are the sectional views, and the FIGS. 1B, 1D and 1F are the plan views. FIG. 1A is the sectional view along the line A-A' in FIG. 1B. FIG. 1C is the sectional view along the line A-A' in FIG. 1D. FIG. 1E is the sectional view along the line A-A' in FIG. 1F. FIG. 2 is a plan view illustrating the semiconductor thin film crystallization method according to the present embodiment.

First, as illustrated in FIGS. 1A and 1B, a silicon oxide film 12 to be a buffer layer is formed on the entire surface of a glass substrate 10 by, e.g., plasma CVD (Plasma Enhanced Chemical Vapor Deposition). The film thickness of the silicon oxide film 12 is, e.g., 400 nm.

Then, an amorphous silicon film 14 is formed on the entire surface by, e.g., plasma CVD. The film thickness of the amorphous silicon film 14 is, e.g., 50-200 nm.

Next, for dehydrogenation, thermal processing is performed, e.g., at 450° C. and for 2 hours.

Next, a plurality of slits 16 are formed in the amorphous silicon film 14 by photolithography. The width W of the slits 16 is, e.g., 5 µm. The pitch $P_X$ of the slits 16 is, e.g., 200 µm. As illustrated in FIG. 2, the slits 16 are formed each uninterruptedly from one end to the other end of the amorphous silicon film 14.

Next, laser beams 18 scan to crystallize the amorphous silicon film 14.

Figure 3:
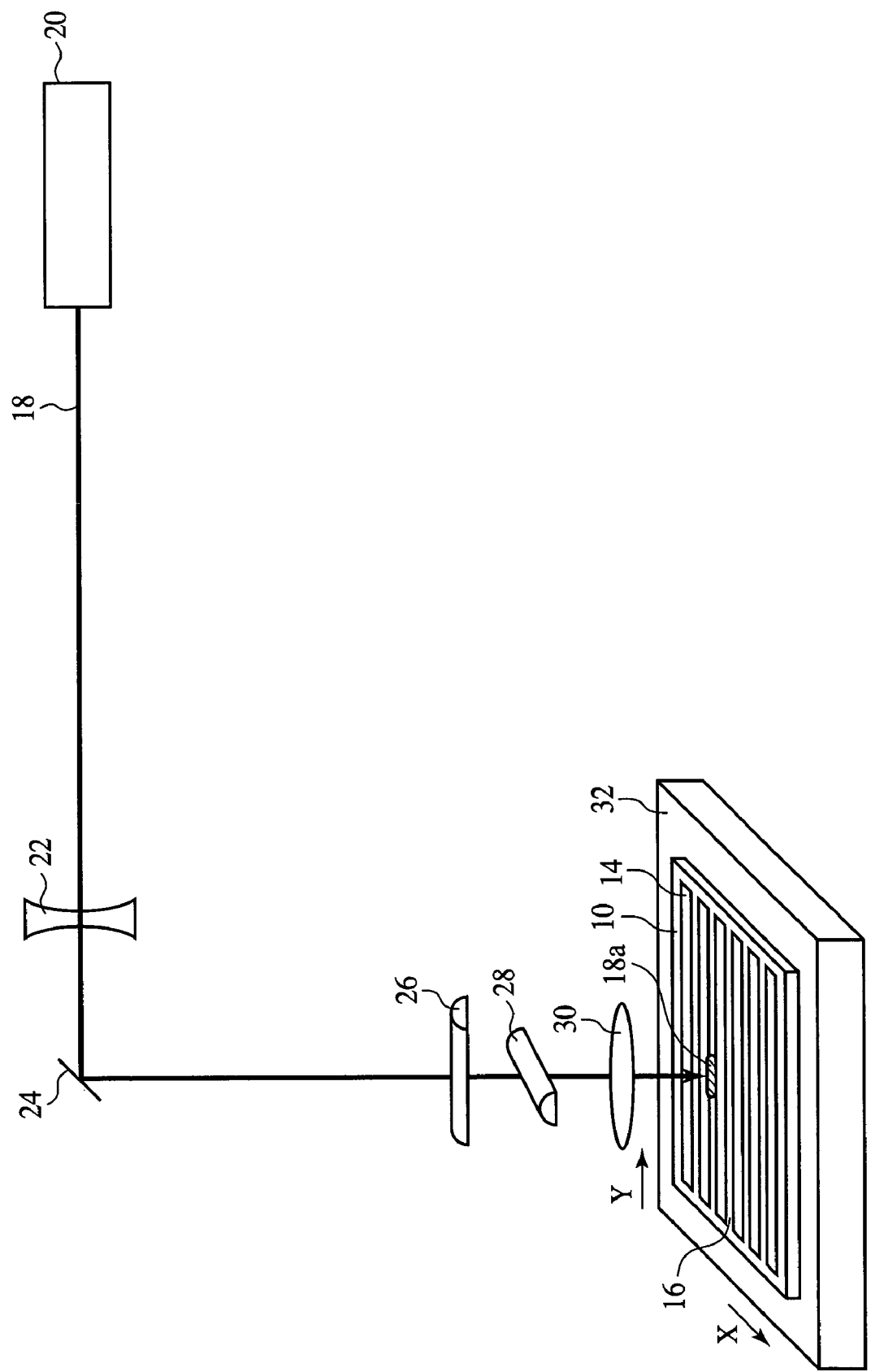
FIG. 3 is a diagrammatic view illustrating the crystallization system.

Here, the crystallizing system used in crystallizing the amorphous silicon film 14 will be explained with reference to FIG. 3. FIG. 3 is a diagrammatic view of the crystallization system.

As illustrated in FIG. 3, the crystallization system comprises a laser beam source 20 which emits laser beams 18, a concave lens 22 which shapes the laser beams 18 emitted by the laser beam source 20, a mirror 24 which reflects in a required direction the laser beams 18 shaped by the concave lens 22, a cylindrical lens 26 which shapes the laser beams 18 reflected by the mirror 24, a cylindrical lens 28 which is disposed perpendicular to the longitudinal direction of the cylindrical lens 26 and further shapes the laser beams 18, a convex lens 30 which further shapes the laser beams 18 shaped by the cylindrical lens 26, and an X-Y stage 32 which displaces the glass substrate 10 in the X and Y directions.

The laser light source 20 is, e.g., a solid laser as the excitation light source which oscillates continuous waves (CWs) by semiconductor excitation using an LD (Laser Diode). Such solid laser can be, e.g., an Nd:YVO$_4$ laser of a 532 nm-wavelength. The output power of the solid laser is, e.g., 6 W. A solid laser of semiconductor excitation is used because the solid laser of semiconductor excitation can provide more stable laser beams 18 than gas lasers.

Figures 4A, 4B:
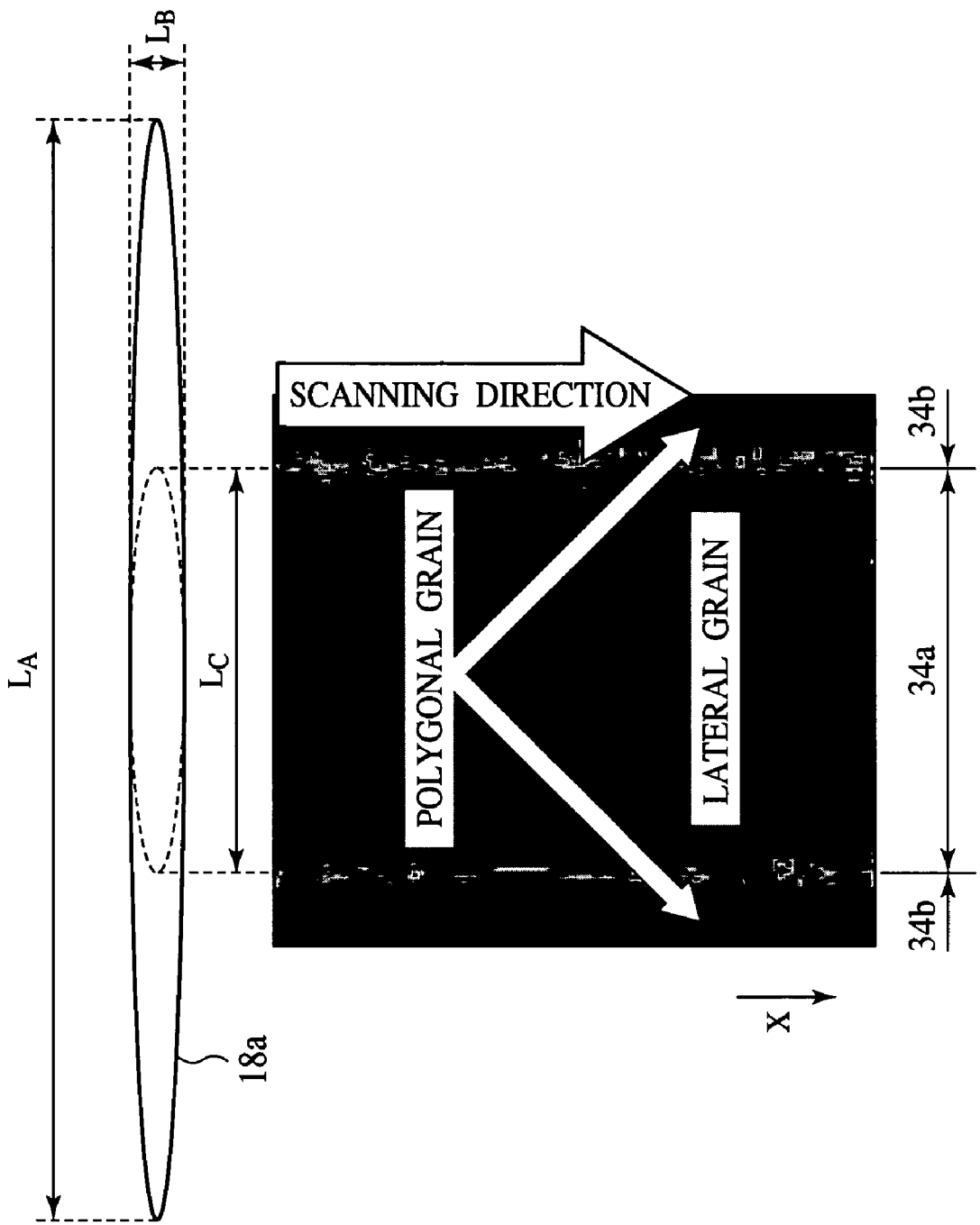
FIGS. 4A and 4B are a plan view illustrating the spot of a laser beam, and a view illustrating a crystal state of silicon obtained by causing the laser beam to scan.

A laser beam 18 emitted by the laser beam source 20 passes through the above-described optical system to have the spot shape, i.e., the shape of the application region 18a in the elliptical shape as illustrated in FIGS. 3 and 4. FIG. 4A is a plan view of the spot shape of the laser beam.

As illustrated in FIG. 4A, the shape of spot 18a of the laser beam 18 is elongate. More specifically, the shape of the spot 18a of the laser beam 18 is the ellipse, e.g., of an about 400 µm-longer axis $L_A$ and an about 20 µm-shorter axis $L_B$. The central part of the laser beam 18 is of higher intensity. The longitudinal length $L_C$ of the higher intensity part of the laser beam 18 is about, e.g., 150 µm. The part of the laser beam 18 except the central part is of not so high intensity.

By using such crystallization system, the laser beam 18 scans the amorphous silicon film 14 as follows.

First, the glass substrate 10 is mounted on the X-Y stage 32. At this time, the glass substrate 10 is mounted with the longitudinal direction of the slits 16 being parallel with the longitudinal direction of the application region 18a of the laser beam 18.

Then, with the laser beam 18 being applied to the amorphous silicon film 14, the glass substrate 10 is displaced by the X-Y stage 32 so that the application region 18a of the laser beam 18 scans perpendicular to the longitudinal direction of the slits 16, i.e., in the X-direction. The scanning speed of the laser beam 18 is, e.g., 50 cm/second.

As illustrated in FIGS. 1C to 1F, when the laser beam 18 scans, the amorphous silicon film 14 in the application region 18a of the laser beam 18 is melted, and the silicon in the parts the application region 18a of the laser beam 18 has passed goes on solidifying. The crystallization of the silicon is taken over along the scanning direction of the laser beam 18, and elongate crystal grains grow along the scanning direction of the laser beam 18.

When the application region 18a of the laser beam 18 intersects the slits 16, the crystal growth of the silicon is not taken over. The length along which the crystal growth is taken over is set somewhat short, whereby the peeling of the film tends not to take place. Thus, according to the present embodiment, even when a solid amorphous silicon film which is not patterned in island in advance, the film is prevented from peeling and can be crystallized well.

FIG. 4B is a view illustrating the crystal state of the silicon provided by causing the laser beam to scan.

As illustrated in FIG. 4B, in the central part 34a of the region scanned by the laser beam 18, the silicon crystal has grown elongate in the direction of the scan of the laser beam 18, i.e., in the X-direction. Such manner of the crystal growth is called lateral growth. Good crystals are obtained in the central part 34a of the region scanned by the laser beam 18, because the intensity of the laser beam is relatively high.

On the other hand, in the part 34b of the region scanned by the laser beam 18, except the central part, the silicon crystals have grown whose crystal grain diameters are not very big. The crystal grain diameters are small in the region 34b of the region scanned by the laser beam 18, except the central part, because the intensity of the laser beam is relatively low.

The region where good crystals can be obtained is only the central part of the region scanned by the laser beam 18. Once scanning of the laser beam 18 cannot crystallize all the amorphous silicon film 14. As illustrated in FIG. 2, the scanning $S_n$ of the laser beam 18 is performed a plurality of times to thereby crystallize all the amorphous silicon film 14.

When the scanning $S_n$ of the laser beam 18 is performed a plurality of times, the laser beam 18 scans so that the tracks of the application region 18a of the laser beam 18 partially overlap each other.

The tracks of the application region 18a of the laser beam 18 partially overlap each other for the following reason.

That is, when the laser beam 18 scans a plurality of times simply without partially overlapping the tracks of the application regions 18a of the laser beam 18, good crystals are obtained only in the central part 34a of the region scanned by the laser beam 18 (see FIGS. 4A and 4B), and in the regions 34b of the region scanned by the laser beam 18 except the central part 34b, good silicon crystals of large grain diameters cannot be obtained.

Thus, in the present embodiment, the laser beam 18 scans so that the tracks of the application regions 18a of the laser beam 18 partially overlap each other, whereby all the amorphous silicon film 14 can be crystallized well.

As described above, according to the present embodiment, the laser beam 18 scans, intersecting the slits 16, whereby when the application region 18a of the laser beam 18 intersects the slits 16, the continuous crystal growth can be interrupted.

With the length over which the crystal growth is taken over set somewhat short, as described above, there is a tendency that the film does not easily peel, and the semiconductor thin film of good crystals can be formed while the film is prevented from peeling. Even when the film peels, the film can be prevented from going on continuously peeling when the application region 18a of the laser beam 18 intersects the slits 16.

Thus, according to the present embodiment, even when the solid amorphous silicon film which is not patterned in islands is crystallized, the semiconductor thin film of good crystals can be formed with high yields while the film is prevented from peeling. According to the present embodiment, the semiconductor film of good crystals can be formed solid, which permits thin film transistors of good electric characteristics to be fabricated in high density.

(Modification 1)

Figure 5:
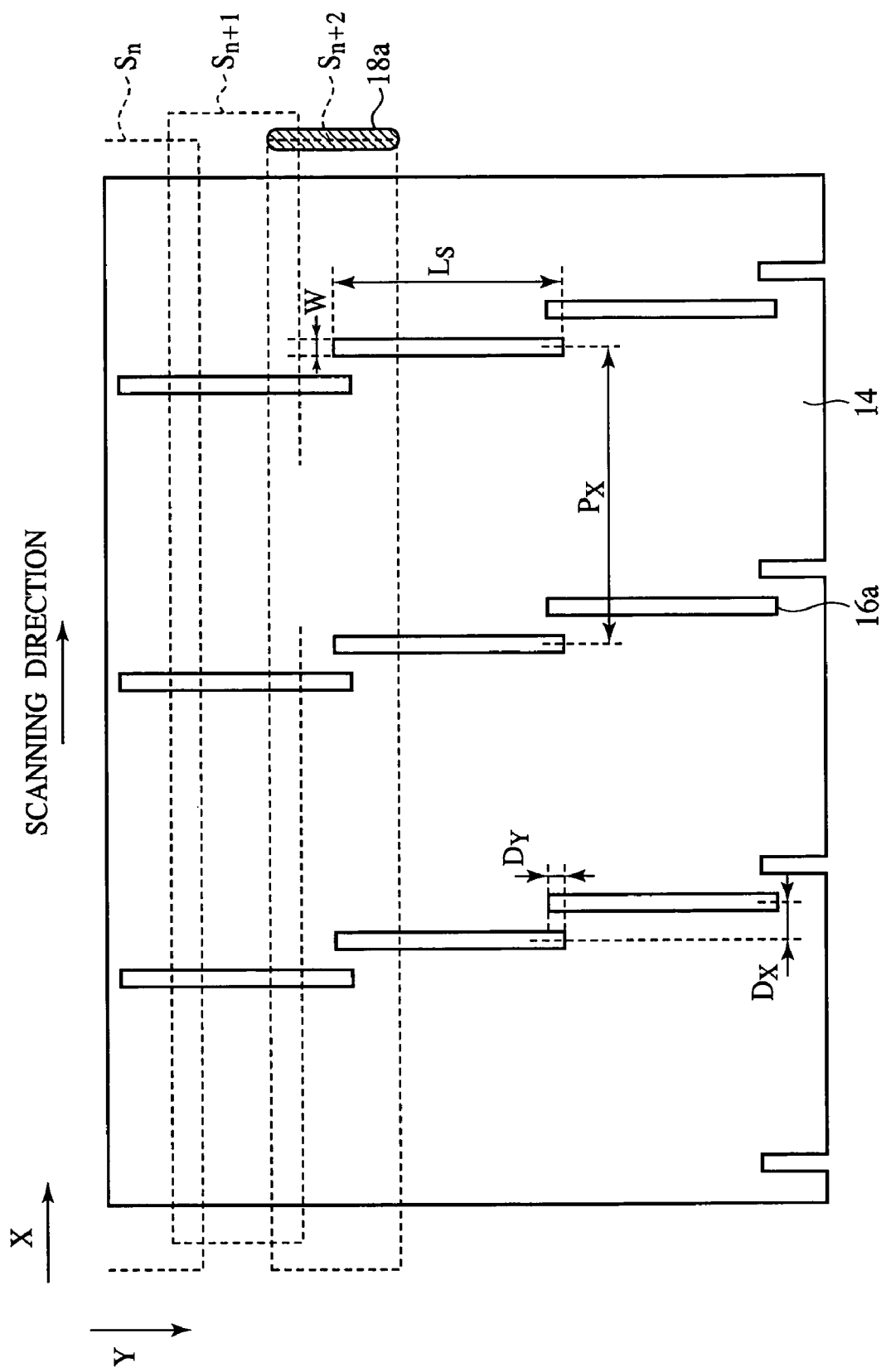
FIG. 5 is a plan view illustrating the semiconductor thin film crystallization method according to Modification 1 of the first embodiment of the present invention.

Next, the semiconductor thin film crystallization method according to Modification 1 of the present embodiment will be explained with reference FIG. 5. FIG. 5 is a plan view illustrating the thin film semiconductor device crystallization method according to the present modification.

The semiconductor thin film crystallization method according to the present modification is characterized mainly in that a plurality of slits 16a whose longitudinal length is relatively small are formed, offset from each other.

As illustrated in FIG. 5, a plurality of slits 16a whose longitudinal length $L_S$ is relatively small are formed in the amorphous silicon film 14. The plurality of slits 16a are formed with the longitudinal direction of them are parallel with each other. The length $L_S$ of the longitudinal direction of the slits 16a is, e.g., 200 μm. The width W of the slits 16a is, e.g., 5 μm, as is in the above. The slits 16a are formed, offset in the X-direction. The offset $D_X$ of the slits 16a in the X-direction is, e.g., 20 μm. The slits 16a are formed, overlapping each other in the Y-direction. The overlapping distance $D_Y$ in the Y-direction of the slits 16a is, e.g., 20 μm. A plurality of the slits 16a arranged in the longitudinal direction form slits which are generally interrupted.

When the scanning $S_n$ is performed on the amorphous silicon film 14 by the laser beam 18, the application region 18a of the laser beam 18 intersects one of the slits 16a.

Thus, in the present modification as well, the continuous crystal growth can be interrupted when the application region 18a of the laser beam 18 intersects the slit 16a.

In the present modification as well, the semiconductor thin film of good crystals can be formed with high yields without patterning the amorphous silicon film in islands.

(Modification 2)

Figure 6:
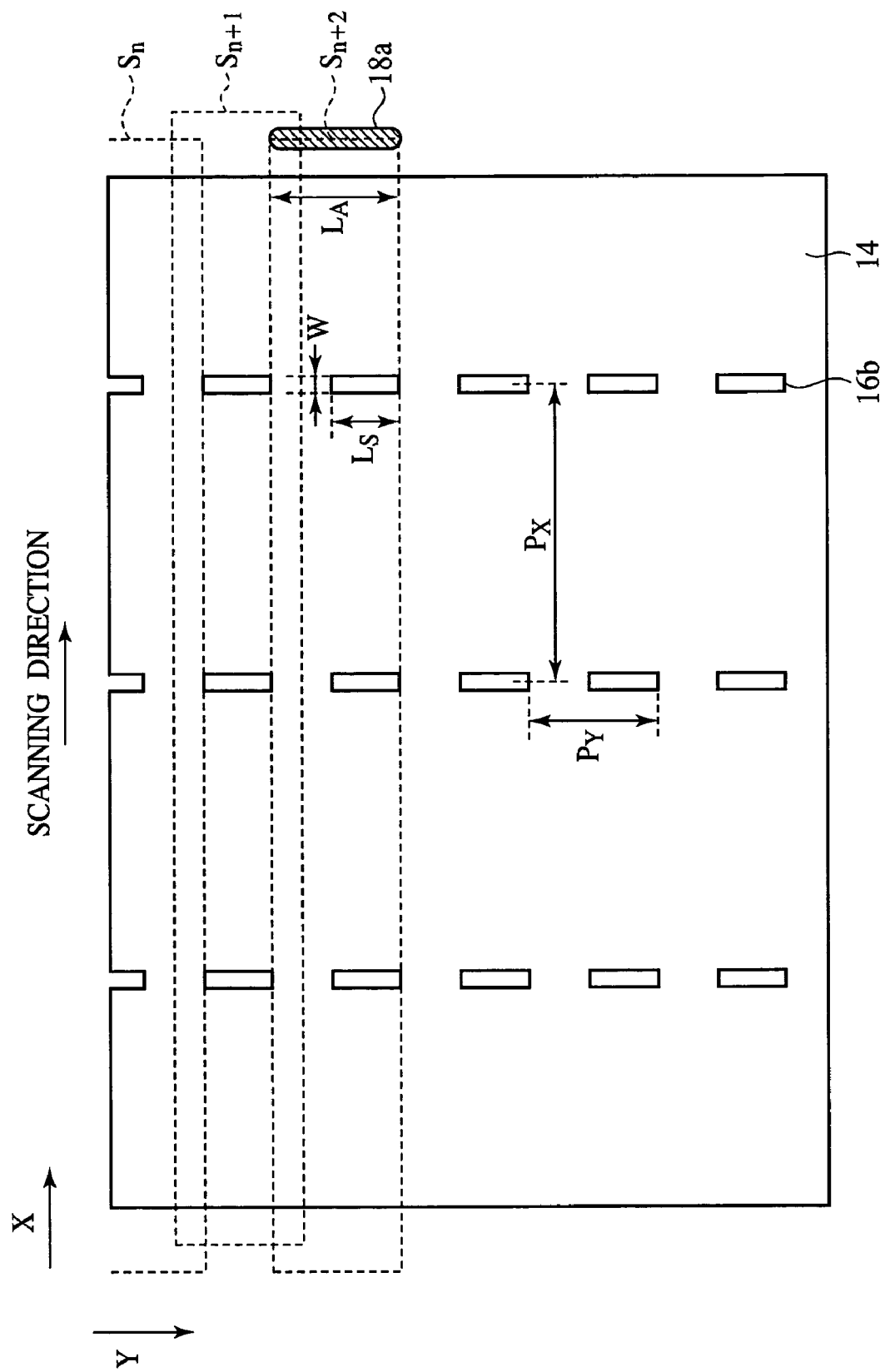
FIG. 6 is a plan view illustrating the semiconductor thin film crystallization method according to Modification 2 of the first embodiment of the present invention.

Next, the semiconductor thin film crystallization method according to Modification 2 of the present embodiment will be explained with reference to FIG. 6. FIG. 6 is a plan view illustrating the semiconductor thin film crystallization method according to the present modification.

The semiconductor thin film crystallization method according to the present modification is characterized mainly in that slits 16b is formed shorter than the longitudinal length of the application region 18a of the laser beam 18.

As illustrated in FIG. 6, a plurality of the slits 16b are formed in the amorphous silicon film 14. The plurality of slits 16b are arranged in the longitudinal direction. A plurality of the slits 16b arranged in the longitudinal direction form slits which are generally interrupted. The longitudinal length $L_S$ of the slit 16b is, e.g., 100 μm. The longitudinal length $L_C$ of the part of the application region 18a of the laser beam 18, where the intensity of the beam is high is, e.g., 150 μm. The longitudinal length $L_S$ of the slit 16b is smaller than the longitudinal length $L_C$ of the part of the application region 18a of the laser beam 18, where the beam intensity is high. The width W of the slit 16b is, e.g., 5 μm. The pitch $P_X$ of slits 16b in the X-direction is, e.g., 200 μm. The pitch $P_Y$ between the slits 16b in the Y-direction is, e.g., 120 μm.

When the scanning $S_n$ of the laser beam 18 is performed on the thus-prepared amorphous silicon film 14, only a part of the application region 18a of the laser beam 18 intersects the slit 16a.

In the present modification, when the application region 18a of the laser beam 18 intersects the slit 16b, all the application region 18a of the laser beam 18 does not intersect the slit 16b, but when at least a part of the application region 18a of the laser beam 18 intersects the slit 16b, then the continuous crystal growth can be interrupted.

Thus, the present modification can grow good crystals while preventing the film from peeling. Even when the film peels, the continuous peeling of the film can be blocked by the slit 16b.

Thus, according to the present modification, without patterning the amorphous silicon film 14 in islands, the semiconductor thin film of good crystals can be formed with high yields.

(Modification 3)

Figure 7:
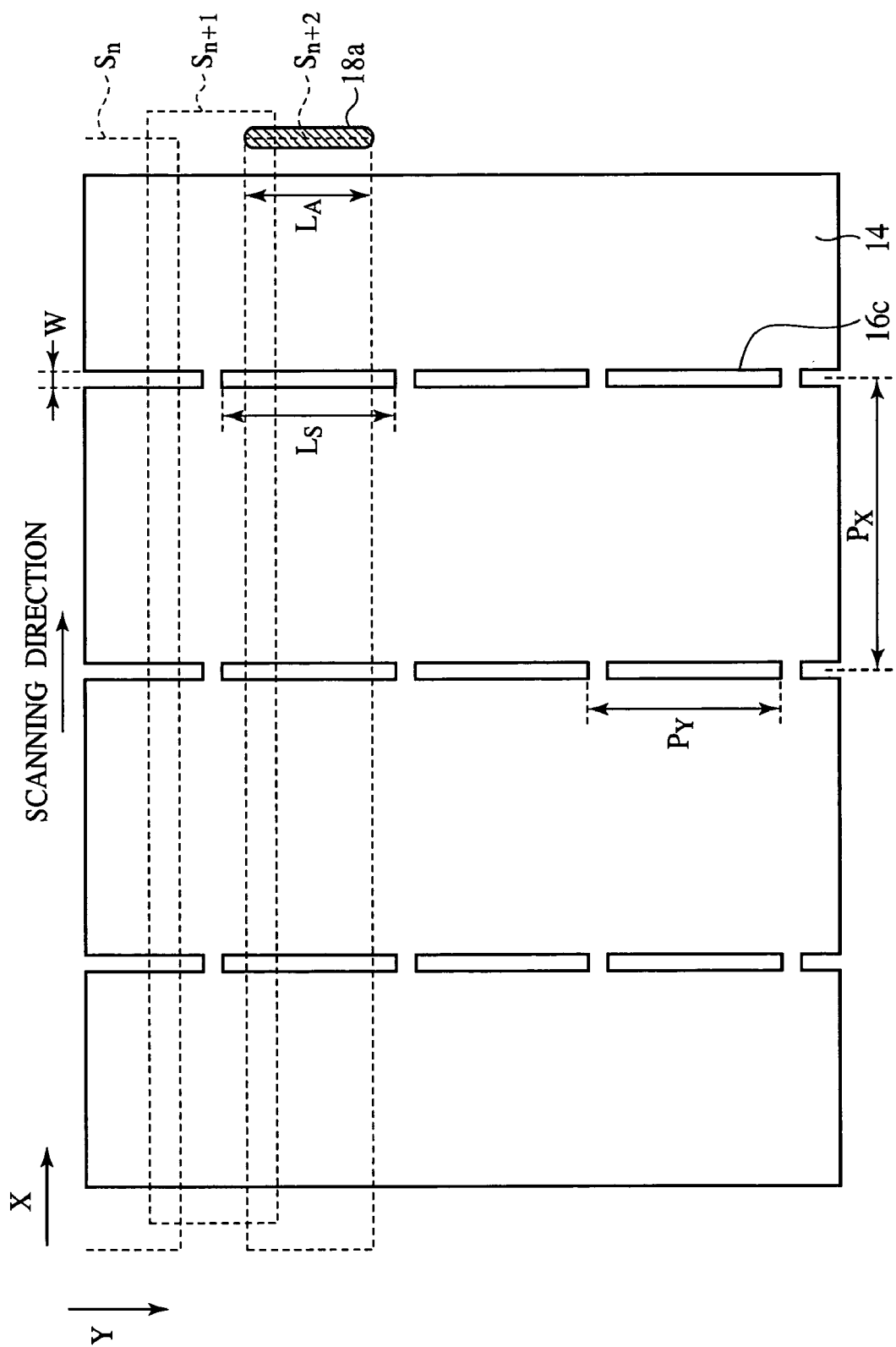
FIG. 7 is a plan view illustrating the semiconductor thin film crystallization method according to Modification 3 of the first embodiment of the present invention.

Next, the semiconductor thin film crystallization method according to Modification 3 will be explained with reference to FIG. 7. FIG. 7 is a plan view illustrating the semiconductor thin film crystallization method according to the present modification.

The semiconductor thin film crystallization method according to the present modification is characterized mainly in that the longitudinal length $L_S$ of a slit 16c is larger than a longitudinal length $L_A$ of the application region 18a of the laser beam 18.

As illustrated in FIG. 7, a plurality of slits 16c are formed in the amorphous silicon film 14. The longitudinal length $L_S$ of the slit 16c is, e.g., 500 µm. The longitudinal length $L_C$ of the part of the application region 18a of the laser beam 18 where the beam intensity is high is, e.g., 150 µm, as described above. The longitudinal length $L_S$ of the slit 16c is larger than the longitudinal length $L_C$ of the part of the application region 18a of the laser beam 18 where the beam intensity is high. The width W of the slit 16c is, e.g., 5 µm. The pitch $P_X$ between the slits 16a arranged in the X-direction is, e.g., 20 µm. The pitch between the slits 16a in the Y-direction is, e.g., 200 µm. A plurality of the slits 16c arranged in the longitudinal direction form a slit which is generally interrupted.

When a laser beam 18 scans the amorphous silicon film 14, all the application region 18a of the laser beam 18 or a part thereof intersects the slit 16c when the application region 18a of the laser beam 18 intersects the slit 16c. When at least a part of the application region 18a of the laser beam 18 intersects the slit 16c, the continuous crystal growth is blocked, and the film can be prevented from peeling. As in the above, even when the film peels, the continuous peeling of the film is blocked when at least a part of the application region 18a of the laser beam 18 intersects the slit 16c.

Thus, according to the present modification as well, without patterning the amorphous silicon film 14 in islands, the semiconductor thin film of good crystals can be formed with high yields.

(Modification 4)

Figure 8:
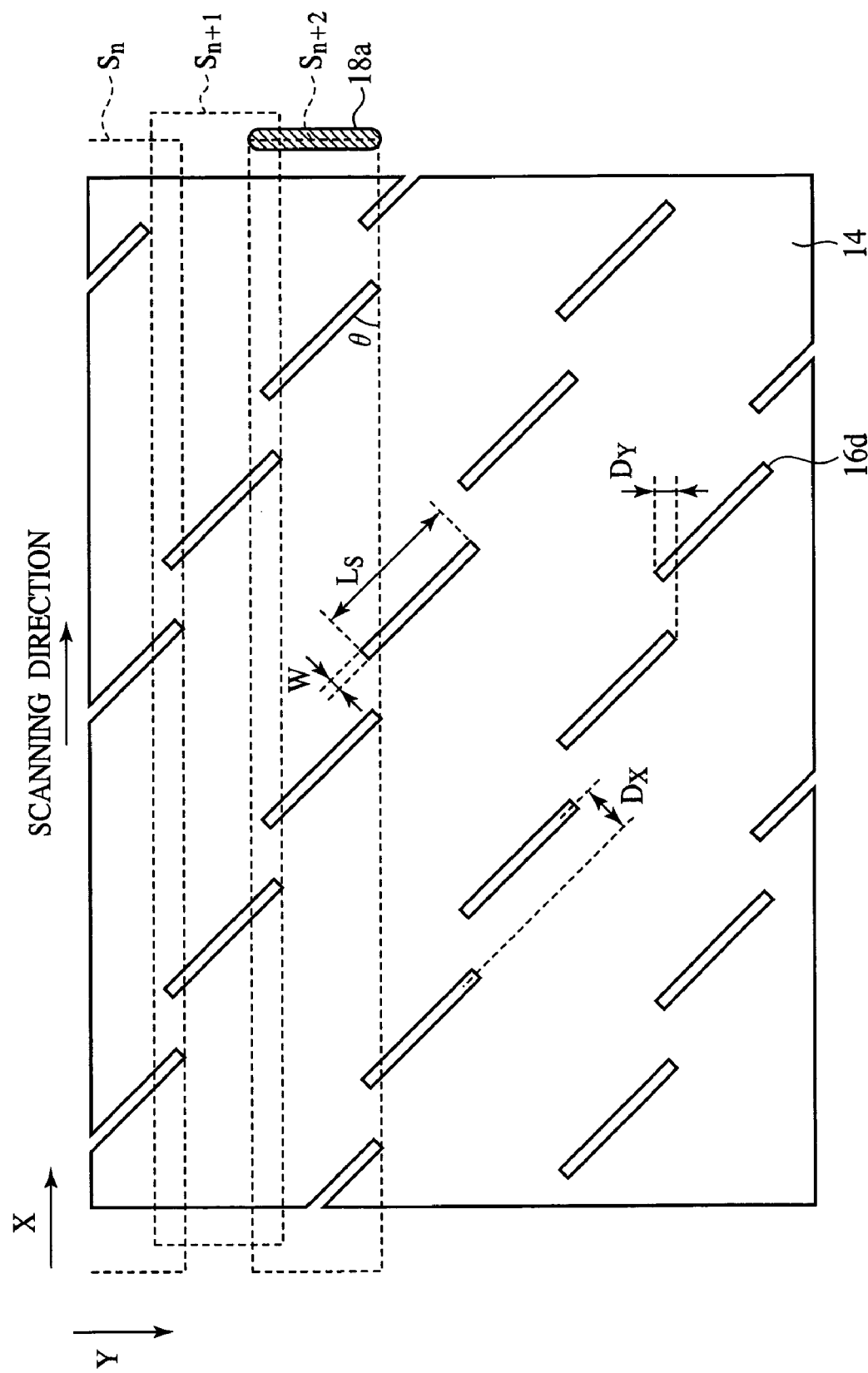
FIG. 8 is a plan view illustrating the semiconductor thin film crystallization method according to Modification 4 of the first embodiment of the present invention.

Next, the semiconductor thin film crystallization method according to Modification 4 of the present embodiment will be explained with reference to FIG. 8. FIG. 8 is a plan view illustrating the semiconductor thin film crystallization method according to the present modification.

The semiconductor thin film crystallization method according to the present modification is characterized mainly in that a plurality of slits 16d whose longitudinal length is relative small are formed obliquely to the scanning direction of the laser beam 18, i.e., the X-direction.

As illustrated in FIG. 8, a plurality of slits 16d are formed in the amorphous silicon film 14. The slits 16d are formed obliquely to the scanning direction of the laser beam 18. The angle θ between the longitudinal direction of the slit 16d and the scanning direction of the laser beam 18 is, e.g., 45 degrees. The width W of the slit 16d is, e.g., 5 µm. The longitudinal length $L_S$ of the slit 16d is, e.g., 300 µm. The plurality of the slits 16d are formed, offset from each other in the X-direction. The offset $D_X$ between the slits 16d in the X-direction is, e.g., 20 µm. The plurality of the slits 16d are formed, overlapping each other in the Y-direction. The overlap $D_Y$ between the slits 16a in the Y-direction is, e.g., 20 µm. A plurality of the slits 16d arranged in the longitudinal direction form a slit which is generally interrupted.

When the laser beam 18 scans the amorphous silicon film 14 with the slits 16d thus formed in, the application region 18a of the laser beam 18 intersects the slit 16d obliquely to the longitudinal direction of the slit 16d. Even when the application region 18a of the laser beam 18 intersects obliquely to the longitudinal direction of the slit 16d, the continuous crystal growth can be interrupted when the application region 18a of the laser beam 18 intersects the slit 16d. Even when the film peels, the continuous peeling of the film can be blocked when the application region 18a of e laser beam 18 intersects the slit 16d.

Thus, according to the present modification as well, without patterning the amorphous silicon film in island, the semiconductor thin film of good crystals can be formed with high yields.

(Modification 5)

Figure 9:
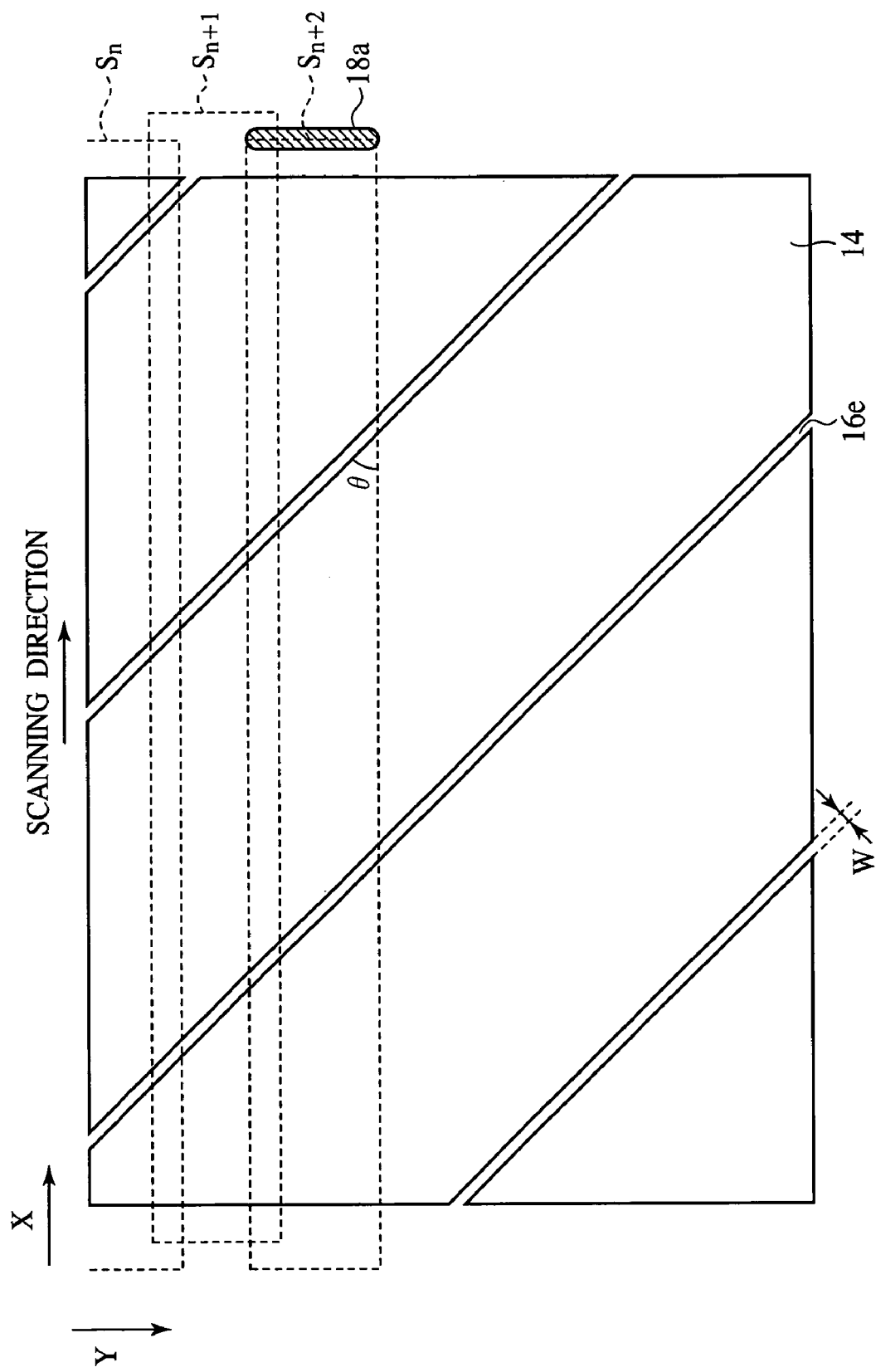
FIG. 9 is a plan view illustrating the semiconductor thin film crystallization method according to Modification 5 of the first embodiment of the present invention.

Next, the semiconductor thin film crystallization method according to Modification 5 of the present embodiment will be explained with reference to FIG. 9. FIG. 9 is a plan view illustrating the semiconductor thin film crystallization method according to the present modification.

The semiconductor thin film crystallization method according to the present modification is characterized mainly in that slits 16e are formed obliquely to the scanning direction of the laser beam 18, and each slit 16e is formed uninterruptedly from one end of the amorphous silicon film 14 to the other end thereof.

As illustrated in FIG. 9, in the amorphous silicon film 14, the slits 16e are formed obliquely to the scanning direction of the laser beam 18. The angle θ between the longitudinal direction of the application region 18a of the laser beam 18 and the longitudinal direction of the slit 16e is, e.g., 45 degrees. The width W of the slit 16e is, e.g., 5 µm.

Even when the laser beam 18 scans the amorphous silicon film 14 with the slits 16e thus formed, the continuous crystal growth is interrupted when the application region 18a of the laser beam 18 intersects the slit 16e. Even when the film peels, the continuous peeling of the film can be interrupted when the application region 18a of the laser beam 18 intersects the slit 16e.

Thus, according to the modification as well, without patterning the amorphous silicon film 14 in islands, the semiconductor thin film of good crystals can be formed with high yields.

A SECOND EMBODIMENT

Figure 10A:
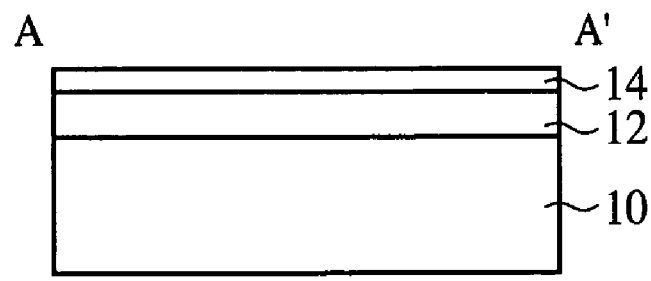
FIGS. 10A to 10C are views illustrating steps of a semiconductor thin film crystallization method according to a second embodiment of the present invention (Part 1).
Figure 10B:
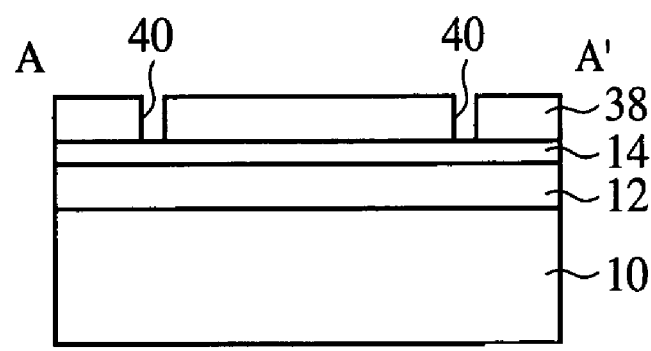
Figure 10C:
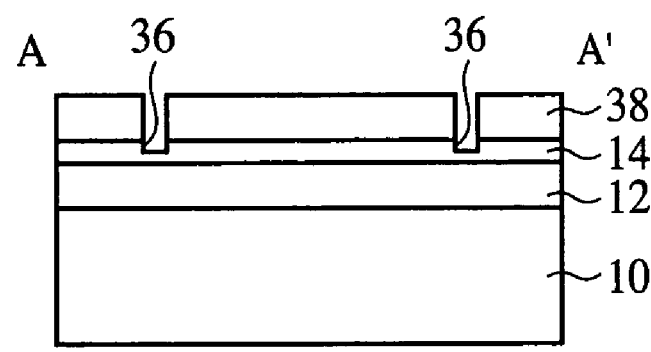
Figure 11A:
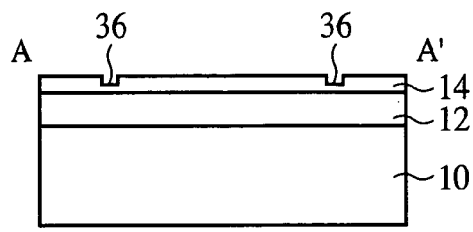
FIGS. 11A to 11F are views illustrating the steps of the semiconductor thin film crystallization method according to the second embodiment of the present invention (Part 2).
Figure 11B:
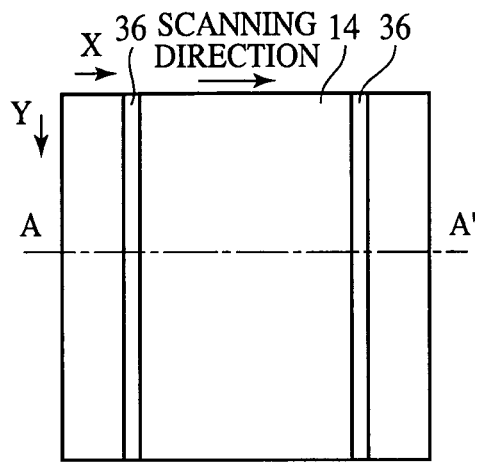
Figure 11C:
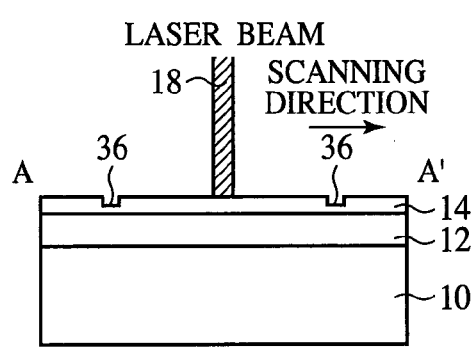
Figure 11D:
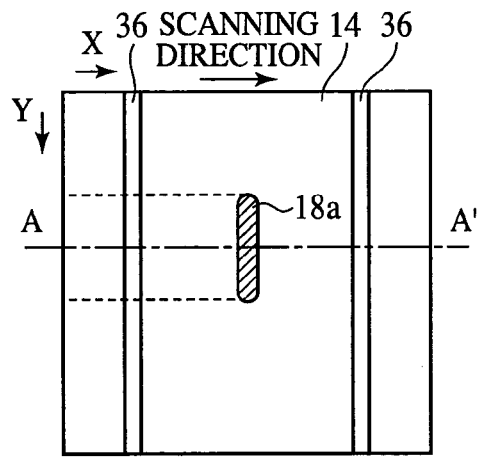
Figure 11E:
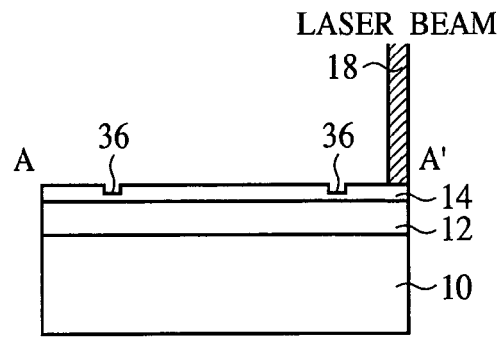
Figure 11F:
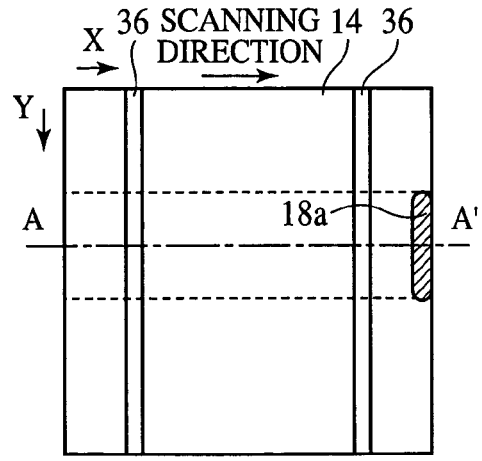

The semiconductor thin film crystallization method according to a second embodiment will be explained with reference to FIGS. 10A to 12. FIGS. 10A to 10C are views illustrating the steps of the semiconductor thin film crystallization method according to the present embodiment (Part 1). FIGS. 10A to 10C are sectional views. FIGS. 11A to 11F are views illustrating the steps of the semiconductor thin film crystallization method according to the present embodiment (Part 2). FIGS. 11A, 11C and 11E are sectional views, and FIGS. 11B, 11D and 11F are plan views. FIG. 11A is the sectional view along the line A-A' in FIG. 11B. FIG. 11C is the sectional view along the line A-A' in FIG. 11D. FIG. 11E is the sectional view along the line A-A' in FIG. 11F. FIG. 12 is a plan view illustrating the semiconductor thin film crystallization method according to the present embodiment. The same members of the present embodiment as those of the semiconductor thin film crystallization method according to the first embodiment are represented by the same reference numbers not to repeat or to simplify their explanation.

The semiconductor thin film crystallization method according to the present embodiment is characterized mainly in that trenches 36 are formed in an amorphous silicon film 14, and a laser beam 18 scans, intersecting the trenches 36.

First, in the same way as in the semiconductor thin film crystallization method according to the first embodiment, a silicon oxide film 12 and the amorphous silicon film 14 are sequentially formed on the entire surface of a glass substrate 10. Then, in the same way as in the semiconductor thin film crystallization method according to the first embodiment, thermal processing is performed for the dehydrogenation (see FIG. 10A).

Next, as illustrated in FIG. 10B, a photoresist film 38 is formed on the entire surface by, e.g., spin coating.

Next, by photolithography, openings 40 are formed in the photoresist film 38 down to the amorphous silicon film 14. The openings 40 are formed from one end of the amorphous silicon film 14 to the other end thereof.

Then, as illustrated in FIG. 10C, with the photoresist film 38 as the mask, the amorphous silicon film 14 is etched. The etched depth of the amorphous silicon film 14 is, e.g., 30 nm from the surface of the amorphous silicon film 14. Thus, as illustrated in FIG. 12, the trenches 36 are formed from one end of the amorphous silicon film 14 to the other end thereof uninterruptedly. The width W of the trenches 36 is, e.g., 5 µm.

Next, as illustrated in FIG. 11A, the photoresist film 38 is removed.

Next, as illustrated in FIGS. 11B and 11C, the laser beam 18 scans, intersecting the trenches 36. The amorphous silicon film 14 is partially interrupted at the parts where the trenches 36 are formed, which prevents to some extent the continuous crystal growth.

With the length over which the crystal growth is taken over set somewhat short, as described above, there is a tendency that the film does not easily peel, and the semiconductor thin film of good crystals can be formed while the film is prevented from peeling. Even when the film peels, the film can be prevented from going on continuously peeling when the application region 18a of the laser beam 18 intersects the trenches 36.

Thus, according to the present embodiment, the semiconductor thin film of good crystals can be formed with high yields without patterning the amorphous silicon film 14 in islands.

A THIRD EMBODIMENT

Figure 13A:
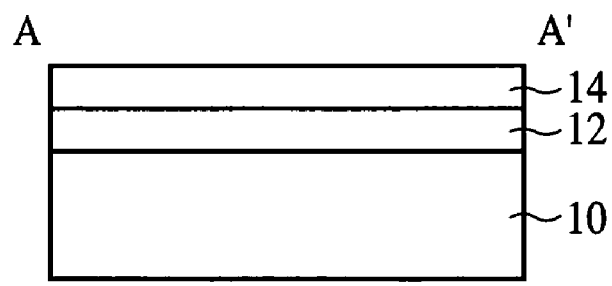
FIGS. 13A to 13C are views illustrating steps of a semiconductor thin film crystallization method according to a third embodiment of the present invention (Part 1).
Figure 13B:
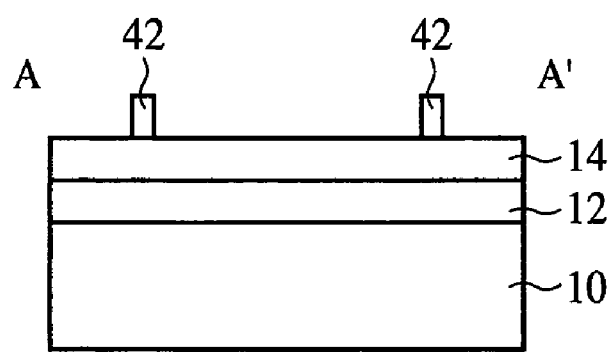
Figure 13C:
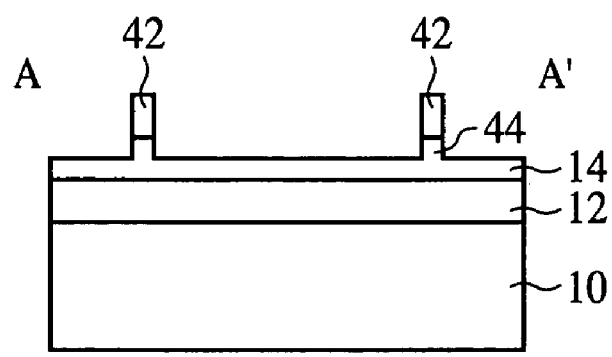
Figure 14A:
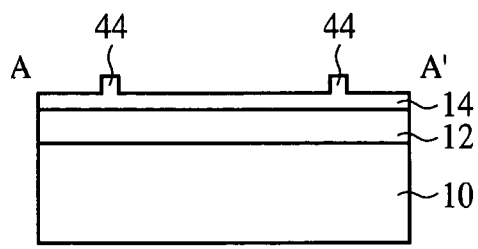
FIGS. 14A to 14F are views illustrating the semiconductor thin film crystallization method according to the third embodiment of the present invention (Part 2).
Figure 14B:
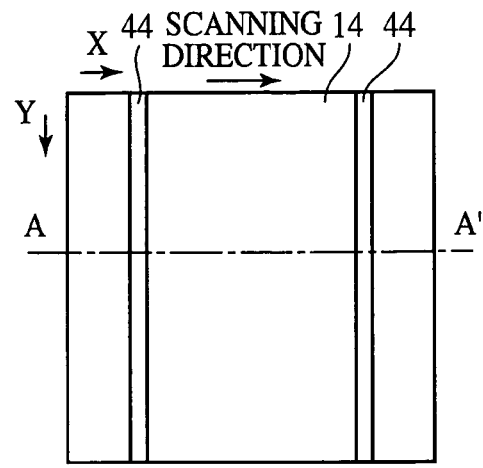
Figure 14C:
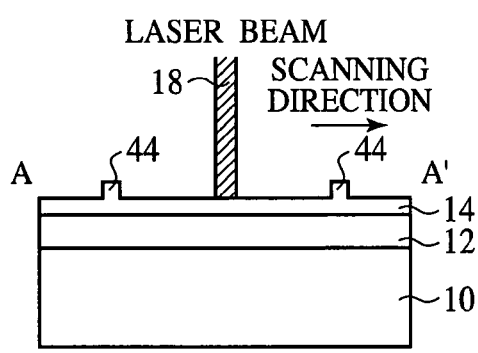
Figure 14D:
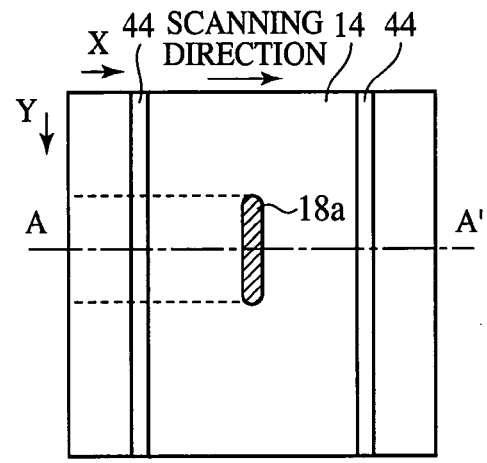
Figure 14E:
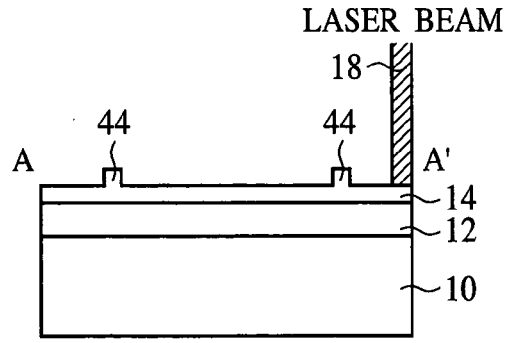
Figure 14F:
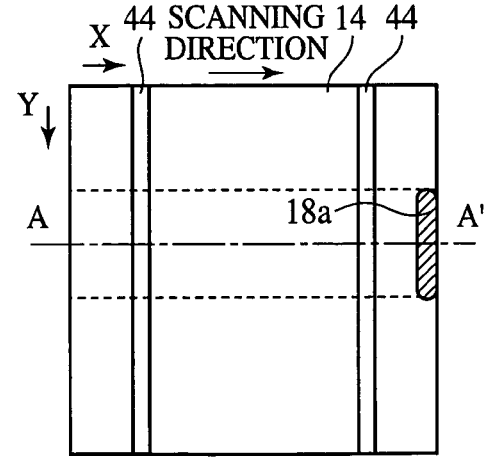
Figure 15:
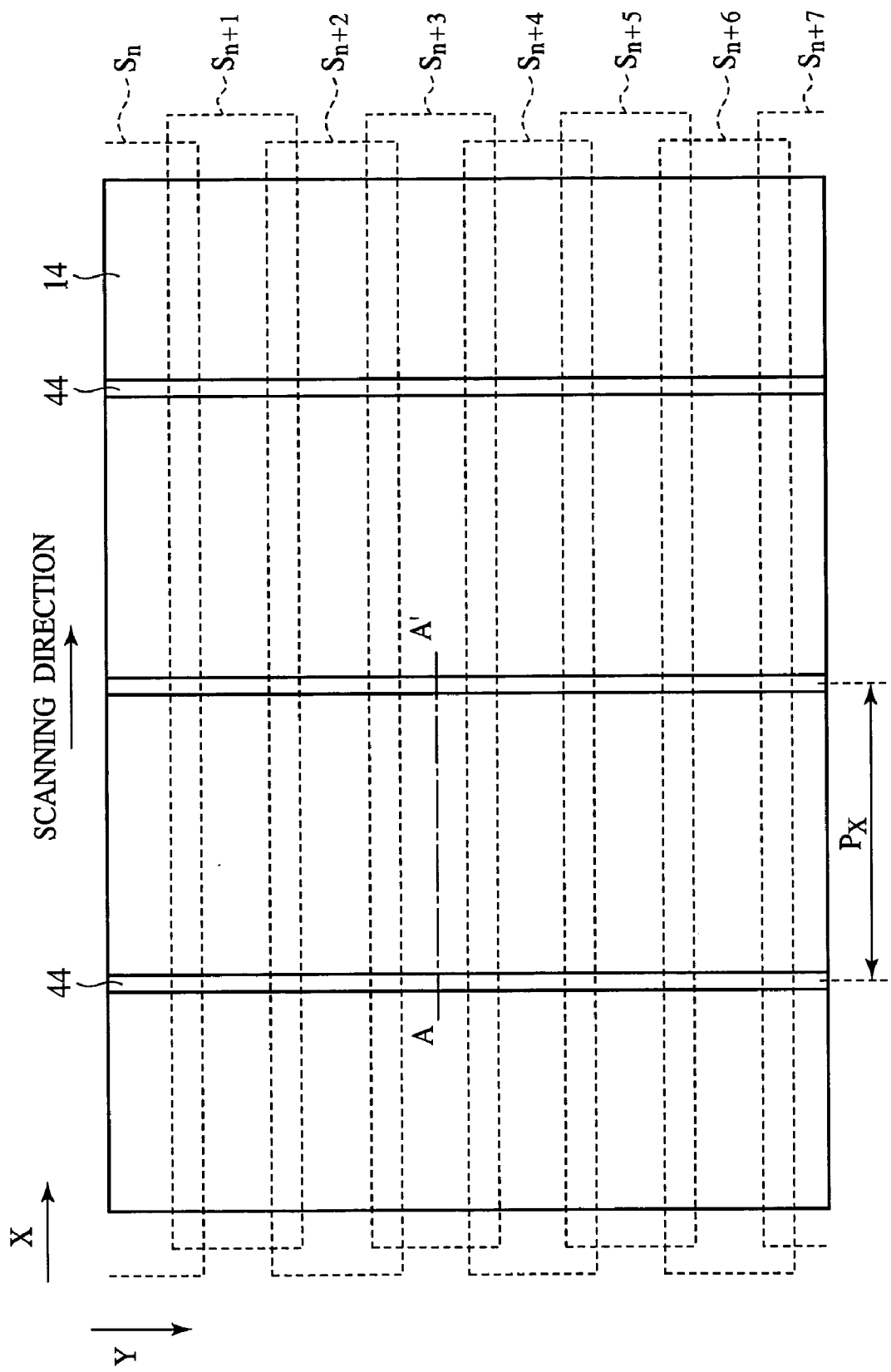
FIG. 15 is a plan view illustrating the semiconductor thin film crystallization method according to the third embodiment of the present invention.

The semiconductor thin film crystallization method according to a third embodiment of the present invention will be explained with reference to FIGS. 13A to 15. FIGS. 13A to 13C are views illustrating the step of the semiconductor thin film crystallization method according to the present embodiment (Part 1). FIGS. 13A to 13C are sectional views. FIGS. 14A to 14F are views illustrating the steps of the semiconductor thin film crystallization method according to the present embodiment (Part 2). FIGS. 14A, 14C and 14E are sectional views, and FIGS. 14B, 14D and 14F are plan views. FIG. 14A is the sectional view along the line A-A' in FIG. 14B. FIG. 14C is the sectional view along the line A-A' in FIG. 14D. FIG. 14E is the sectional view along the line A-A' in FIG. 14F. FIG. 15 is a plan view illustrating the semiconductor thin film crystallization method according to the present embodiment. The same member of the present embodiment as those the semiconductor thin film crystallization method according to the first or the second embodiment are represented by the same reference numbers not to repeat or to simplify their explanation.

The semiconductor thin film crystallization method according to the present embodiment is characterized mainly in that the surface of an amorphous silicon film 14 is partially etched to form band-shaped patterns 42 of the amorphous silicon film 14, and a laser beam 18 scans, intersecting the band-shaped patterns 42.

First, in the same way as in the semiconductor thin film crystallization method according to the first embodiment, a silicon oxide film 12 is formed on the entire surface of a glass substrate 10.

Next, the amorphous silicon film 14 is formed thick on the entire surface by, e.g., plasma CVD. The film thickness of the amorphous silicon film 14 is, e.g., 300 nm.

Next, in the same way as in the semiconductor thin film crystallization method according to the first embodiment, thermal processing for dehydrogenation is performed (see FIG. 13A).

Next, as illustrated in FIG. 13B, a photoresist film 42 is formed on the entire surface by, e.g., spin coating.

Then, by photolithography, the photoresist film 42 is patterned in band-shape. The photoresist film 42 are formed continuously from one end of the amorphous silicon film 14 to the other end thereof.

Then, as illustrated in FIG. 13C, with the photoresist film 42 as the mask, the amorphous silicon film 14 is etched down to a 200 nm-depth from the surface of the amorphous silicon film 14. Thus, the band-shaped patterns 44 of the amorphous silicon film 14 are formed on the surface of the amorphous silicon film 14. The width W of the band-shaped patterns 44 is, e.g., 10 µm. The band-shaped patterns 44 are formed continuously from one end of the amorphous silicon film 14 to the other end thereof.

Then, as illustrated in FIG. 14A, the photoresist film 42 is removed.

Then, as illustrated in FIGS. 14B and 14C, the laser beam 18 scans, intersecting the band-shaped patterns 44. In the regions where the band-shaped patterns 44 are formed, the band-shaped patterns 44 add to the film thickness of the amorphous silicon film 14, and the parts have large heat capacity. Accordingly, the amorphous silicon film 14 in the region where the band-shaped patterns 44 are formed is not melted. Thus, the continuous crystal growth is interrupted when the application region 18a of the laser beam 18 intersects the band-shaped patterns 44.

With the length over which the crystal growth is taken over set somewhat short, as described above, there is a tendency that the film does not easily peel, and the semiconductor thin film of good crystals can be formed while the film is prevented from peeling. Even when the film peels, the film can be prevented from going on continuously peeling when the application region 18a of the laser beam 18 intersects the band-shaped patterns 44.

Thus, according to the present embodiment, the semiconductor thin film of good crystals can be formed with high yields without patterning the amorphous silicon film 14 in islands.

A FOURTH EMBODIMENT

Figure 16A:
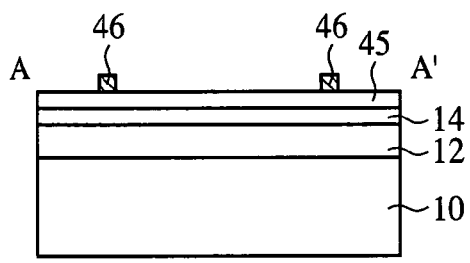
FIGS. 16A to 16F are views illustrating steps of a semiconductor thin film crystallization method according to a fourth embodiment of the present invention.
Figure 16B:
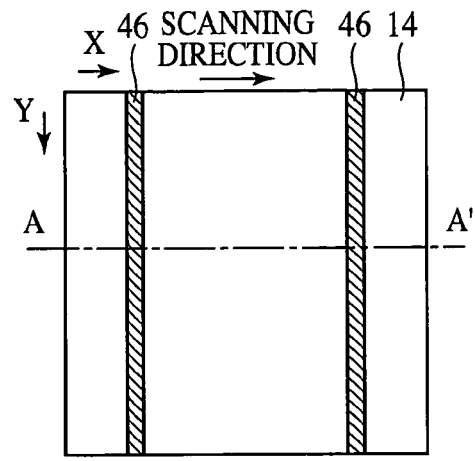
Figure 16C:
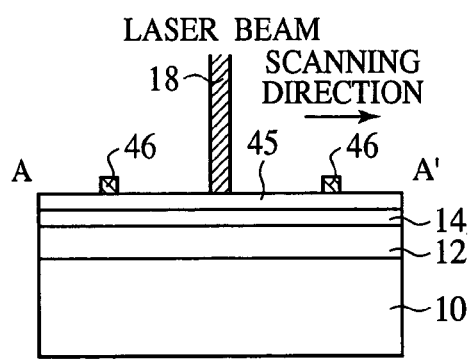
Figure 16D:
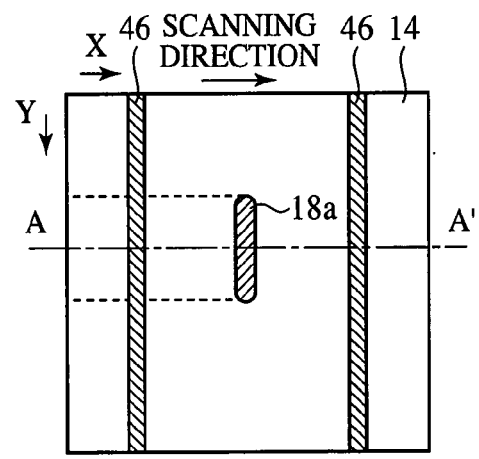
Figure 16E:
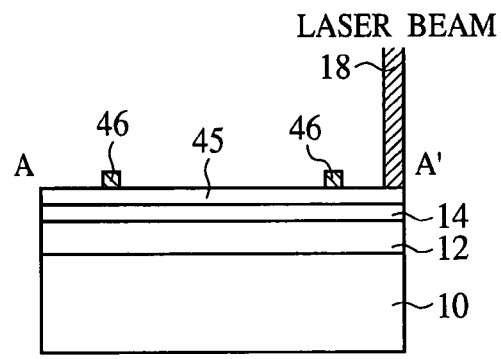
Figure 16F:
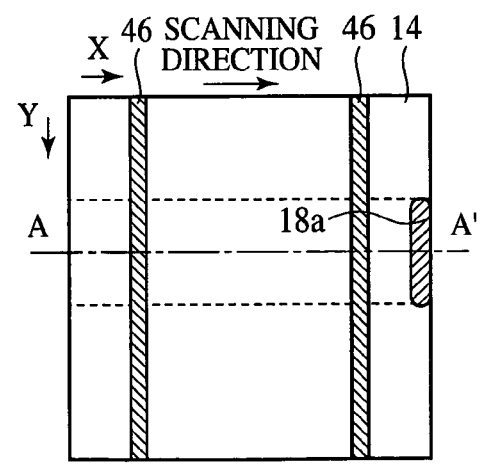

The semiconductor thin film crystallization method according to a fourth embodiment will be explained with reference to FIGS. 16A to 17. FIGS. 16A to 16F are views illustrating steps of the semiconductor thin film crystallization method according to the present embodiment. FIGS. 16A, 16C and 16E are sectional views, and FIGS. 16B, 16D and 16F are plan views. FIG. 16A is the sectional view along the line A-A' in FIG. 16B. FIG. 16C is the sectional view along the line A-A' in FIG. 16D. FIG. 16E is the sectional view along the line A-A' in FIG. 16F. FIG. 17 is a plan view illustrating the semiconductor thin film crystallization method according to the present embodiment. The same members of the present embodiment as those of the semiconductor thin film crystallization method according to the first to the third embodiments are represented by the same reference numbers not to repeat or to simplify their explanation.

The semiconductor thin film crystallization method according to the present embodiment is characterized mainly in that band-shaped patterns 46 of a metal film are formed above an amorphous silicon film 14, and a laser beam 18 scans, intersecting the band-shaped patterns 46.

First, in the same way as in the semiconductor thin film crystallization method according to the first embodiment, a silicon oxide film 12 and an amorphous silicon film 14 are sequentially formed on the entire surface of a glass substrate 10.

Next, a silicon oxide film 45 is formed on the amorphous silicon film 14 by, e.g., CVD. The film thickness of the silicon oxide film 45 is, e.g., 100 nm. The silicon oxide film 45 is for isolating the amorphous silicon film 14 from the band-shaped patterns 46 of the metal film.

Next, in the same way as in the semiconductor thin film crystallization method according to the first embodiment, thermal processing for dehydrogenation is performed.

Then, a metal film is formed by, e.g., sputtering. The metal film can be, e.g., a refractory metal film, such as molybdenum film, tungsten film or others.

Next, the metal film is patterned into band-shapes by photolithography (see FIG. 16A). The band-shaped patterns are formed continuous from one end of the amorphous silicon film 14 to the other end thereof (see FIG. 17). The width of the patterns is, e.g., 10 µm. Thus, the band-shaped patterns 46 of the metal film are formed.

Next, as illustrated in FIGS. 16B and 16C, the laser beam 18 scans, intersecting the band-shaped patterns 46 of the metal film. In the regions where the band-shaped patterns 46 of the metal film, the laser bean 18 is reflected on the band-shaped patterns 46. Accordingly, in the region where the band-shaped patterns 46 are formed, the amorphous silicon film 14 is not melted. Thus, the continuous crystal growth is interrupted when the application region 18a of the laser beam 18 intersects the band-shaped patterns 14.

With the length over which the crystal growth is taken over set somewhat short, as described above, there is a tendency that the film does not easily peel, and the semiconductor thin film of good crystals can be formed while the film is prevented from peeling. Even when the film peels, the film can be prevented from going on continuously peeling when the application region 18a of the laser beam 18 intersects the band-shaped patterns 46.

Thus, according to the present embodiment, the semiconductor thin film of good crystals can be formed with high yields without patterning the amorphous silicon film 14 in islands.

A FIFTH EMBODIMENT

Figure 18A:
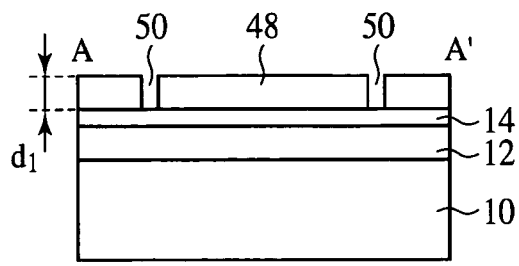
FIGS. 18A to 18F are views illustrating steps of a semiconductor thin film crystallization method according to a fifth embodiment of the present invention.
Figure 18B:
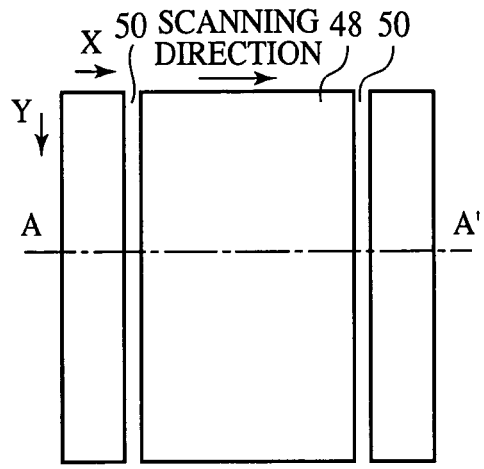
Figure 18C:
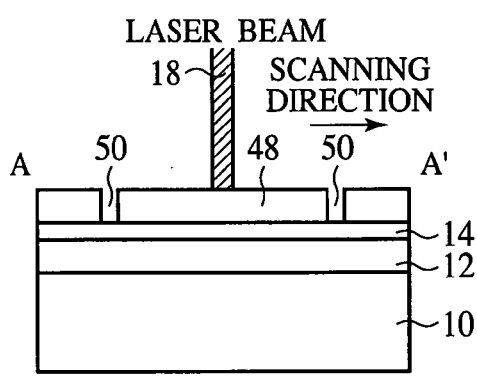
Figure 18D:
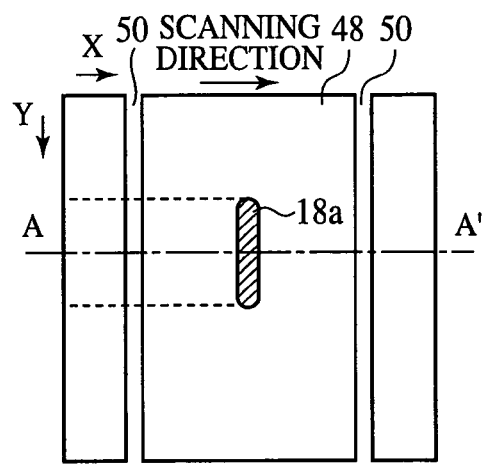
Figure 18E:
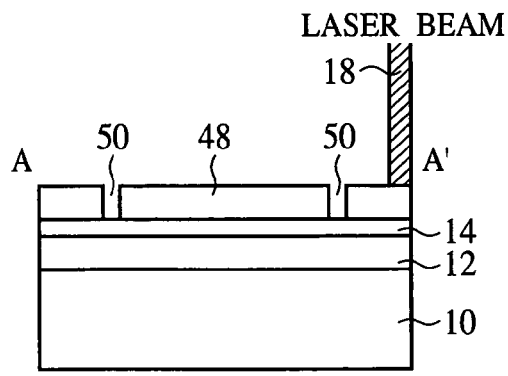
Figure 18F:
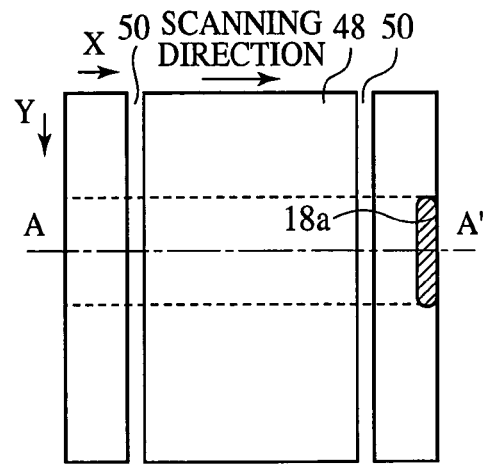
Figure 19:
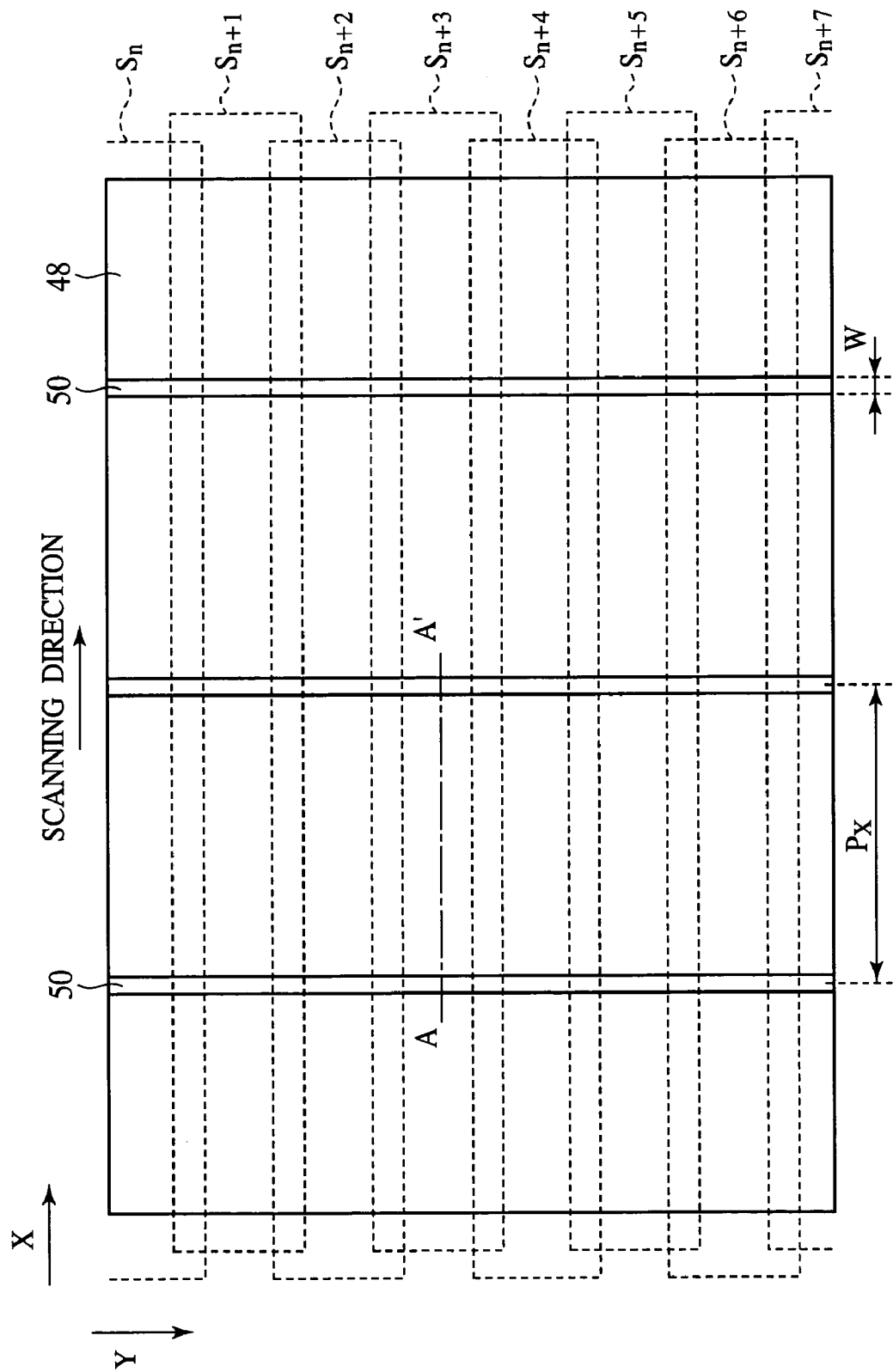
FIG. 19 is a plan view illustrating the semiconductor thin film crystallization method according to the fifth embodiment of the present invention.

The semiconductor thin film crystallization method according to a fifth embodiment of the present invention will be explained with reference to FIGS. 18A to 19. FIGS. 18A to 18F are views illustrating steps of the semiconductor thin film crystallization method according to the present embodiment. FIGS. 18A, 18C and 18E are sectional views, and FIGS. 18B, 18D and 18F are plan views. FIG. 18A is the sectional view along the line A-A' in FIG. 18B. FIG. 18C is the sectional view along the line A-A' in FIG. 18D. FIG. 18E is the sectional view along the line A-A' in FIG. 18F. FIG. 19 is a plan view illustrating the semiconductor thin film crystallization method according to the present embodiment. The same members of the present embodiment as those of the semiconductor thin film crystallization method according to the first to the fourth embodiments are represented by the same reference numbers not to repeat or to simplify their explanation.

The semiconductor thin film crystallization method according to the present embodiment is characterized mainly in that a dielectric film 48 with slits 50 formed in is formed on an amorphous silicon film 14, and a laser beam 18 scans, intersecting the slits 48.

First, in the same way as in the semiconductor thin film crystallization method according to the first embodiment, a silicon oxide film 12 and an amorphous silicon film 14 are sequentially formed on the entire surface of a glass substrate 10.

Next, a dielectric film 48 is formed on the entire surface by, e.g., CVD. The dielectric film 48 is, e.g., a silicon oxide film. The film thickness $d_1$ of the dielectric film 48 is $\lambda/4n$ or $\lambda(m+1)/4n$. Here, n represents a refractive index of the dielectric film. When the dielectric film 48 is silicon oxide film, the refractive index n is 1.42. $\lambda$ is a wavelength of the laser beam. The wavelength $\lambda$ of the laser beam is, e.g., 532 nm. m is a positive integer. When the film thickness of the dielectric film 48 is so set, the reflectance of the laser beam 18 in the regions where the dielectric film 48 is formed is minimum. Accordingly, the film thickness of the dielectric film 48 is so set, whereby the laser beam 18 can be sufficiently fed to the amorphous silicon film 14.

Next, in the same way as in the semiconductor thin film crystallization method according to the first embodiment, thermal processing for dehydrogenation is performed.

Next, the slits 50 are formed in the dielectric film 48 by photolithography (see FIG. 18A). The slits 50 are formed uninterruptedly from one end of the amorphous silicon film 14 to the other end thereof (see FIG. 19). The width W of the slits 50 is, e.g., 10 µm.

The film thickness $d_2$ at which the reflectance of the laser bean 18 is maximum is 0 or $\lambda m/2n$. In the present embodiment, in the regions where the slits 50 are formed, the film thickness $d_2$ of the dielectric film 48 is 0 nm, and the laser beam 18 can be reflected at large reflectance in the region where the slits 50 are formed.

Then, as illustrated in FIGS. 18B and 18C, the laser beam 18 scans, intersecting the slits 50. At this time, the intensity and the scanning speed of the laser beam 18 are suitably set so that the amorphous silicon film 14 is melted in the regions where the dielectric film 48 is formed, and in the regions where the slits 50 are formed, the amorphous silicon film 14 is not melted. Thus, according to the present embodiment, the continuous crystal growth is interrupted when the application region 18a of the laser beam 18 intersects the slits 50.

With the length over which the crystal growth is taken over set somewhat short, as described above, there is a tendency that the film does not easily peel, and the semiconductor thin film of good crystals can be formed while the film is prevented from peeling. Even when the film peels, the film can be prevented from going on continuously peeling when the application region 18a of the laser beam 18 intersects the slits 50.

Thus, according to the present embodiment, the semiconductor thin film of good crystals can be formed with high yields without patterning the amorphous silicon film 14 in islands.

A SIXTH EMBODIMENT

Figure 20A:
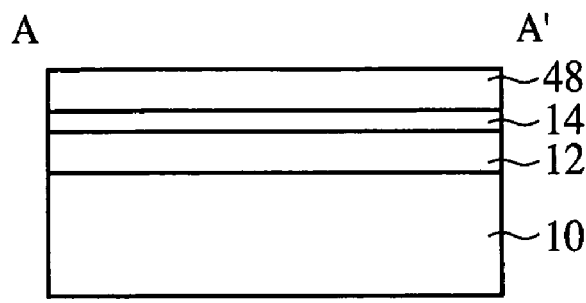
FIGS. 20A to 20C are views illustrating steps of a semiconductor thin film crystallization method according to the sixth embodiment of the present invention (Part 1).
Figure 20B:
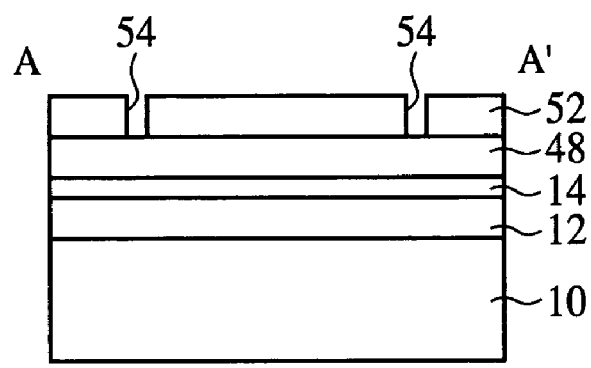
Figure 20C:
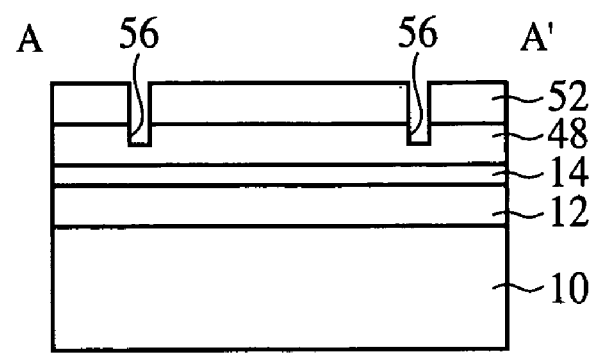
Figure 21A:
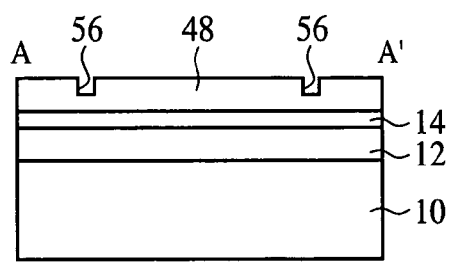
FIGS. 21A to 21F are views illustrating the semiconductor thin film crystallization method according to the sixth embodiment of the present invention (Part 2).
Figure 21B:
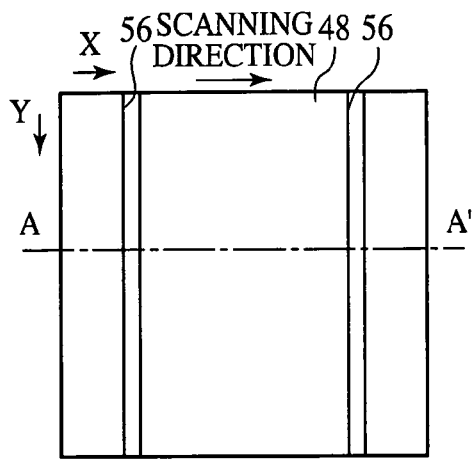
Figure 21C:
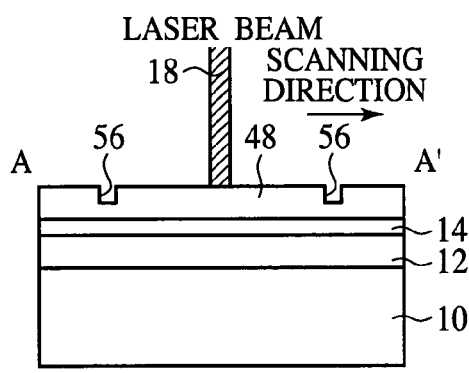
Figure 21D:
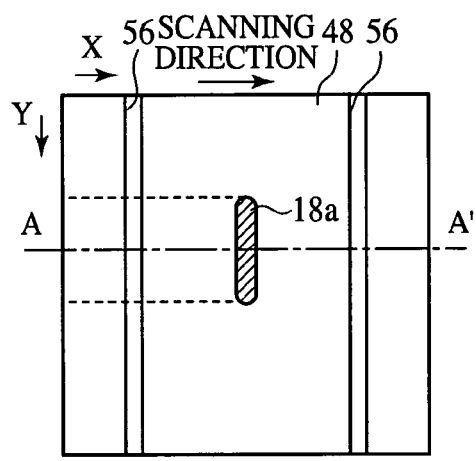
Figure 21E:
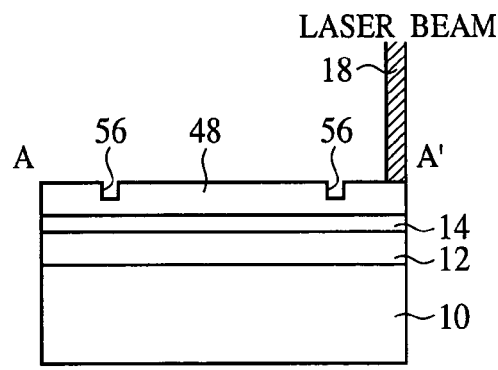
Figure 21F:
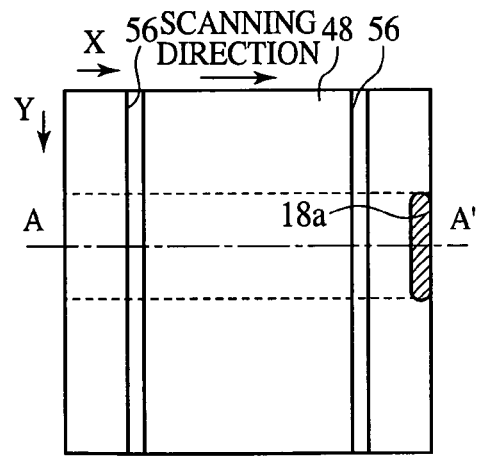

The semiconductor thin film crystallization method according to a sixth embodiment of the present invention will be explained with reference to FIGS. 20A to 22. FIGS. 20A to 20C are views illustrating steps of the semiconductor thin film crystallization method according to the present embodiment (Part 1). FIGS. 20A to 20C are sectional views. FIGS. 21A to 21F are views illustrating the semiconductor thin film crystallization method according to the present embodiment (Part 2). FIGS. 21A, 21C and 21E are sectional views, and FIGS. 21B, 21D and 21F are plan views. FIG. 21A is the sectional view along the line A-A' in FIG. 21B. FIG. 21C is the sectional view along the line A-A' in FIG. 21D. FIG. 21E is the sectional view along the line A-A' in FIG. 21F. The same member of the present embodiment as those of the semiconductor thin film crystallization method according to the first to the fifth embodiments are represented by the same reference numbers not to repeat or to simplify their explanation.

The semiconductor thin film crystallization method according to the present embodiment is characterized mainly in that a dielectric film 48 with trenches 52 formed in is formed on an amorphous silicon film 14, and a laser beam 18 scans, intersecting the trenches 52.

First, in the same way as in the semiconductor thin film crystallization method according to the first embodiment, a silicon oxide film 12 and the amorphous silicon film 14 are sequentially formed on the entire surface of a glass substrate 10.

Then, the dielectric film 48 is formed on the entire surface by, e.g., CVD. The dielectric film 48 is, e.g., a silicon oxide film. The film thickness $d_1$ of the dielectric film 48 is $\lambda/4n$ or $\lambda(m+1)/4n$. As described above, when the film thickness of the dielectric film 48 is so set, the reflectance of the laser beam 18 in the regions where the dielectric film 48 is formed is minimum. Thus, the film thickness of the dielectric film 48 is so set, whereby the laser beam 18 can be sufficiently fed to the amorphous silicon film 14.

Next, in the same way as in the semiconductor thin film crystallization method according to the first embodiment, thermal processing for dehydrogenation is performed.

Then, as illustrated in FIG. 20B, a photoresist film 52 is formed on the entire surface by, e.g., spin coating.

Then, by photolithography, openings 54 are formed in the photoresist film 52 down to the dielectric film 48. The openings 54 are formed uninterruptedly from one end of the amorphous silicon film 14 to the other end thereof.

Figure 22:
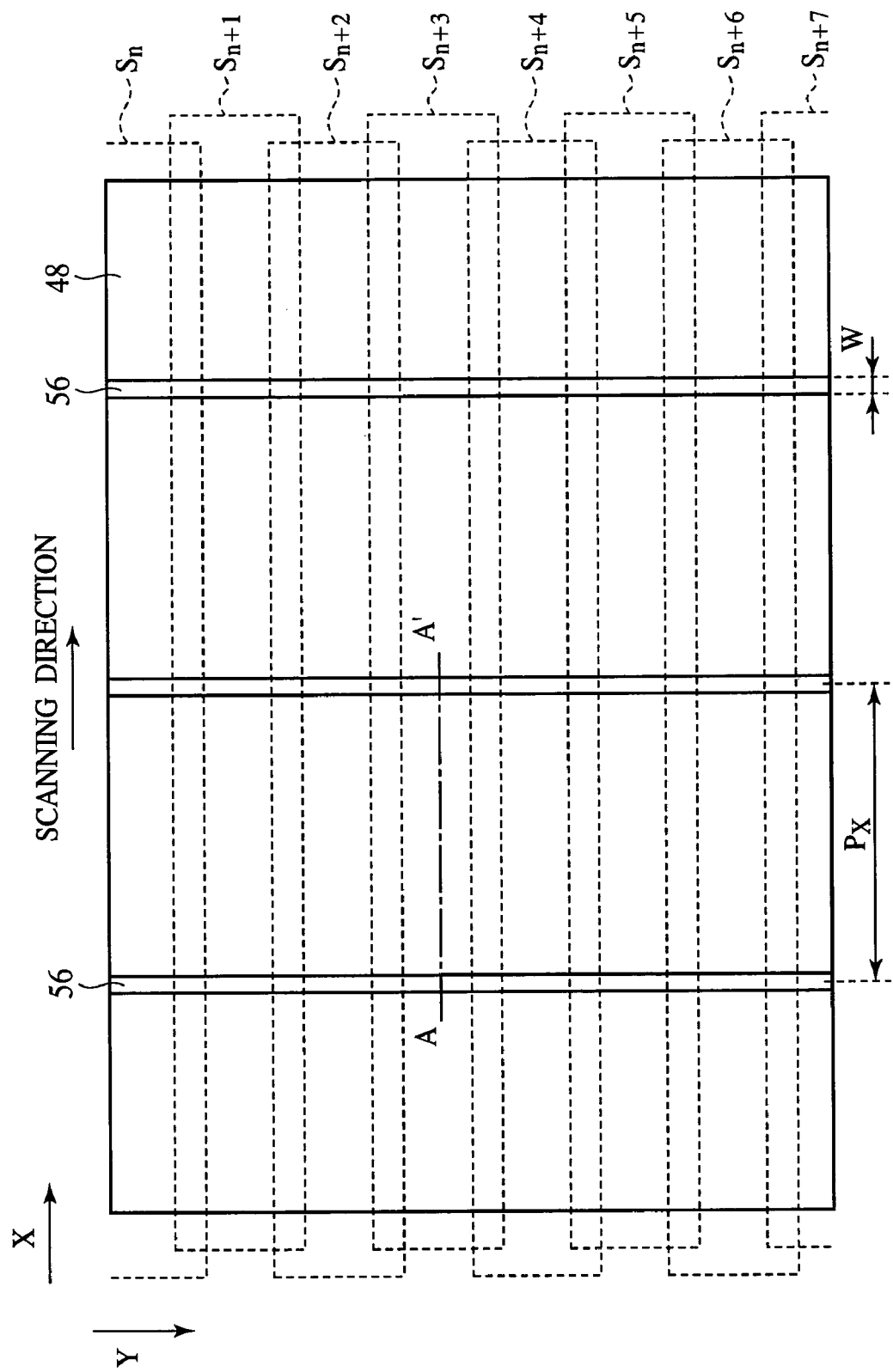
FIG. 22 is a plan view illustrating the semiconductor thin film crystallization method according to the sixth embodiment of the present invention.
Figure 23:
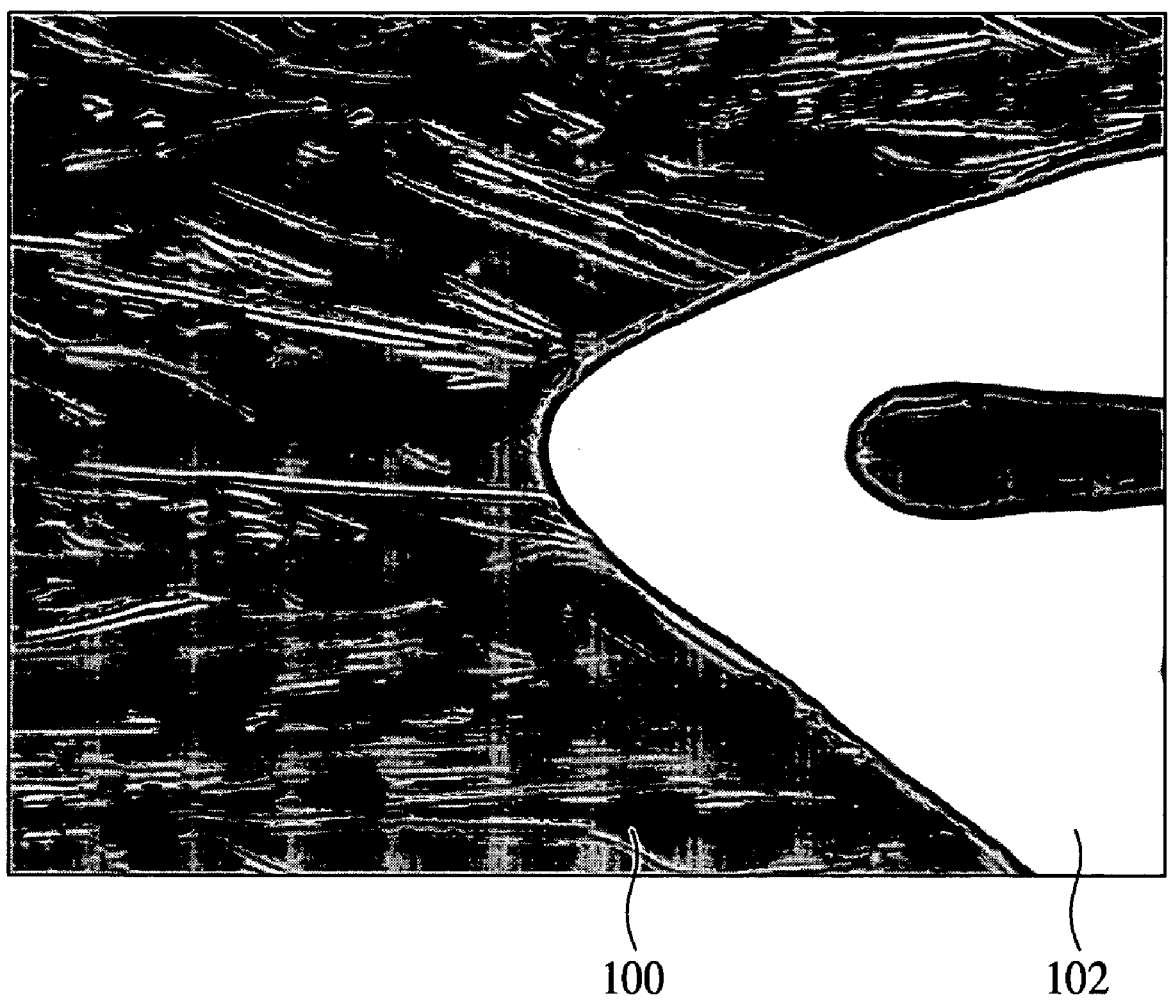
FIG. 23 is a view illustrating the peeling of the film.
Figure 24A:
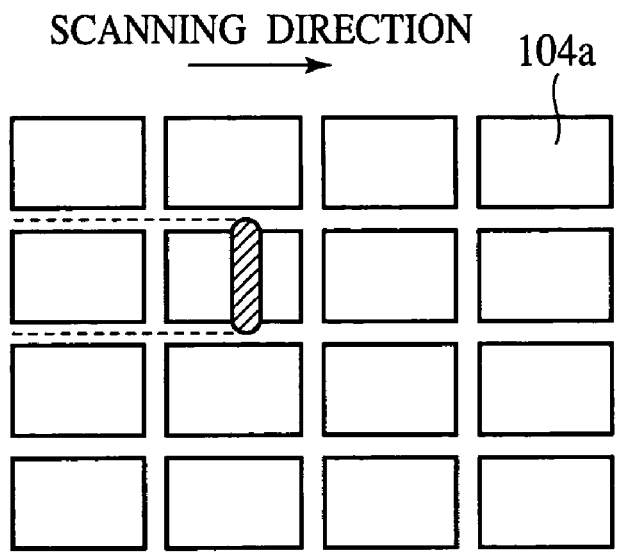
FIGS. 24A and 24B are plan views illustrating the layout of the island patterns.
Figure 24B:
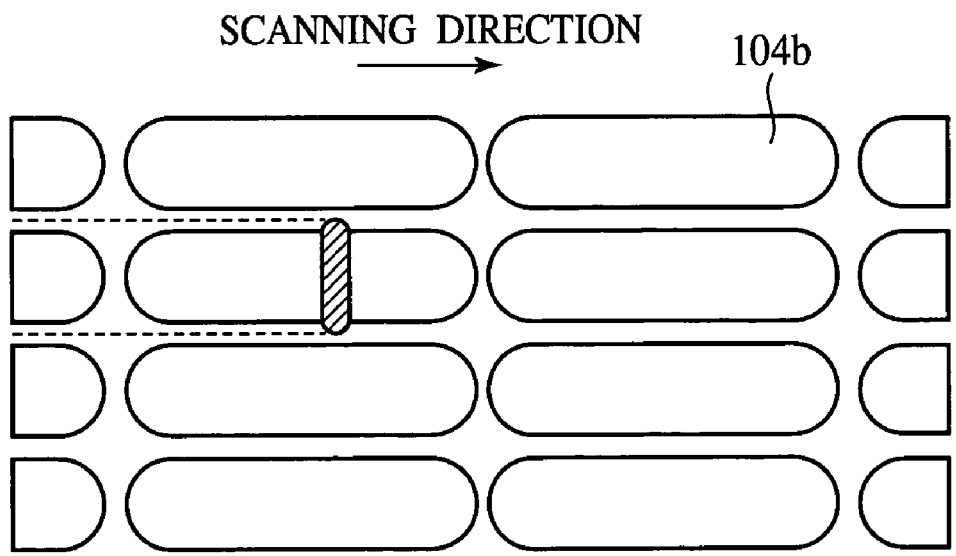
Figure 25A:
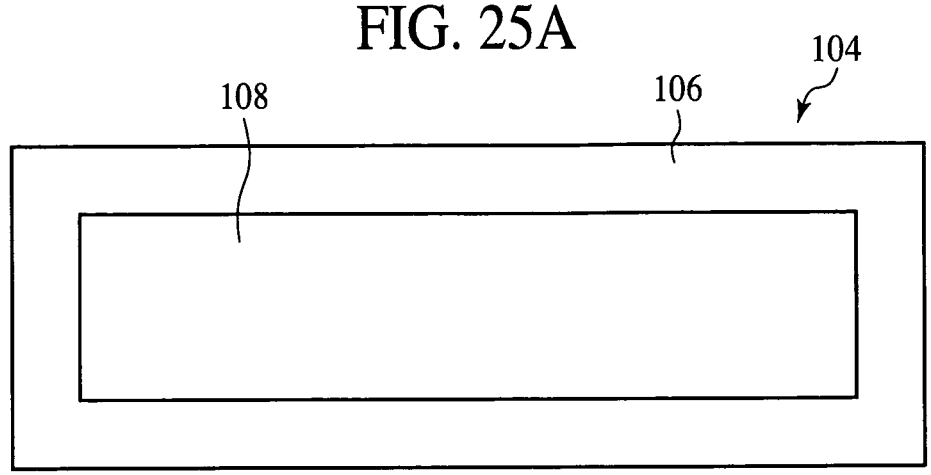
FIGS. 25A to 25C are views illustrating crystallizing the island patterns to form thin film transistors.
Figure 25B:
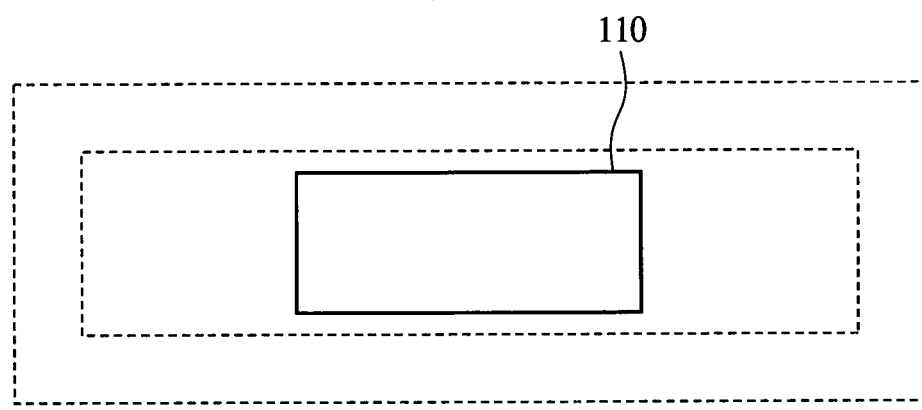
Figure 25C:
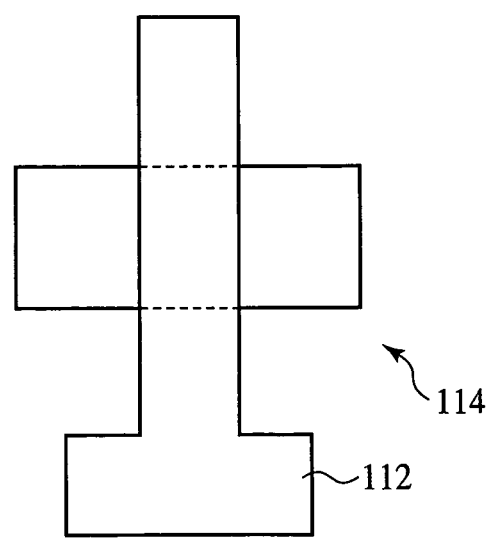

Then, as illustrated in FIG. 20C, with the photoresist film 52 as the mask, the dielectric film 48 is etched to thereby form the trenches 56. As described above, the film thickness of the dielectric film 48 which makes the reflectance of the laser beam 18 maximum is 0 or $\lambda m/2n$. In the present embodiment, the depth of the trenches 56 are set so that the film thickness of the dielectric film 48 immediately below the trenches 56 is $\lambda m/2n$. As illustrated in FIG. 22, the trenches 56 are formed from one end of the amorphous silicon film 14 to the other end thereof. The width W of the trenches 56 is, e.g., 10 μm.

Then, as illustrated in FIG. 21A, the photoresist film 52 is removed.

Then, as illustrated in FIG. 22, the laser beam 18 scan, intersecting the trenches 56. At this time, the intensity and the scanning speed of the laser beam 18 are suitably set so that the amorphous silicon film 14 is melted in the regions where the trenches 56 are not formed, and in the regions where the trenches 56 are formed, the amorphous silicon film 14 is not melted. Thus, according to the present embodiment, the continuous growth is interrupted when the application region 18a of the laser beam 18 intersects the trenches 56.

With the length over which the crystal growth is taken over set somewhat short, as described above, there is a tendency that the film does not easily peel, and the semiconductor thin film of good crystals can be formed while the film is prevented from peeling. Even when the film peels, the film can be prevented from going on continuously peeling when the application region 18a of the laser beam 18 intersects the trenches 56.

Thus, according to the present embodiment, the semiconductor thin film of good crystals can be formed with high yields without patterning the amorphous silicon film 14 in islands.

MODIFIED EMBODIMENTS

The present invention is not limited to the above-described embodiments and can cover other various modifications.

For example, in the above-described embodiments, the laser beam is applied at the first surface of the glass substrates but may be applied at the second surface of the glass substrates.

In the above-described embodiments, the substrates are glass substrates. However, the substrates are not limited to the glass substrates and can be suitably any other substrate.

In the second to the fifth embodiments, the trenches 36, 56, the band-shaped patterns 44, 46 and the slits 50 are formed uninterruptedly from one end of the amorphous silicon films 14 to the other end thereof. However, the plane shapes of the trenches 36, 56, the band-shaped patterns 44, 46 and the slits 50 are not limited to the above. As described in Modifications 1 to 5 of the first embodiments, the plane shapes of the trenches 36, 56, the band-shaped patterns 44, 46 and the slits 50 may be suitably set.

In the above-described embodiments, amorphous silicon film is crystallized to form the semiconductor thin film of the silicon. However, the material of the film to be crystallized is not essentially silicon. Film of any other material is crystallized to form the semiconductor thin film.

In the above-described embodiments, the laser is Nd:YVO$_4$ laser. However, the laser is not essentially Nd:YVO$_4$ laser and may be, e.g., Nd:YAG laser, Nd:YID laser or others.

In the above-described embodiments, the dielectric films 48 are silicon oxide film. However, the dielectric film 48 is not essentially silicon oxide film and can be of any other material.

In the above-described embodiments, the silicon oxide films 12 is formed between the glass substrates 10 and he amorphous silicon films 14. The film to be formed between the glass substrate 10 and the amorphous silicon films 14 is not limited to silicon oxide film. For example, a layer film of a silicon oxide film and a silicon nitride film may be formed between the glass substrates 10 and the amorphous silicon films 14.

In the above-described embodiments, the glass substrates 10 are displaced by the X-Y stage 32 to cause the application region 18a of the laser beam 18 to scan. However, the laser beam 18 may be moved to thereby cause the application region 18a of the laser beam 18 to scan.

In the above-described embodiments, the shape of the spot 18a of the laser beam 18, i.e., the application region 18a is elliptical. However, the shape of the application region 18a of the laser bean 18 is not essentially elliptical and may be suitably set.

INDUSTRIAL APPLICABILITY

The semiconductor thin film crystallization method according to the present invention is useful to form a semiconductor thin film of good crystals with high yields without patterning a film in islands.

The invention claimed is:

1. A semiconductor thin film crystallization method comprising the steps of:
   forming a semiconductor thin film over a substrate;
   forming a band-shaped portion for blocking crystal growth of the semiconductor thin film in the semiconductor film or over the semiconductor thin film without patterning the semiconductor thin film into islands, the band-shaped portion being formed linearly; and
   crystallizing the semiconductor thin film by causing an energy beam of a continuous wave to scan in a direction transverse to both a longitudinal direction of the band-shaped portion for blocking crystal growth, and a longitudinal length of an application region of the energy beam, to thereby crystallize the semiconductor thin film,
   wherein in the step of forming the band-shaped potion, a plurality of the band-shaped portions are formed, spaced from each other in a direction transverse to a longitudinal direction of the band-shaped portion, and
   in the step of crystallizing the semiconductor thin film, the energy beam is caused to scan, sequentially intersecting said plurality of the band-shaped portions.

2. A semiconductor thin film crystallization method according to claim 1, wherein
   the step of forming the band-shaped portion for blocking crystal growth of the semiconductor thin film includes a step of forming a slit in the semiconductor thin film; and
   in the step of crystallizing the semiconductor thin film, the energy beam is caused to scan in a direction transverse to the longitudinal direction of the slits.

3. A semiconductor thin film crystallization method according to claim 2, wherein
   in the step of crystallizing the semiconductor thin film, the energy beam is caused to scan in a direction substantially perpendicular to the longitudinal direction of the slit.

4. A semiconductor thin film crystallization method according to claim 2, wherein
   in the step of forming the slit, the slit is formed uninterruptedly from one end of the semiconductor thin film to the other end thereof.

5. A semiconductor thin film crystallization method according to claim 2, wherein
   in the step of forming the slit, the slit is formed interruptedly.

6. A semiconductor thin film crystallization method according to claim 2, wherein
   in the step for forming the slit, a plurality of the slits are formed, spaced from each other in a direction transverse to the longitudinal direction of the slits, and
   in the step of crystallizing the semiconductor thin film, the energy beam is caused to scan, sequentially intersecting the plurality of the slits.

7. A semiconductor thin film crystallization method according to claim 1, wherein
   the step of forming the band-shaped portion for blocking crystal growth of the semiconductor thin film includes a step of forming a dielectric film over the semiconductor thin film, and a step of forming a slit in the dielectric film, and
   in the step of crystallizing the semiconductor thin film, the energy beam is caused to scan in a direction transverse to the longitudinal direction of the slits.

8. A semiconductor thin film crystallization method according to claim 7, wherein
   in the step of crystallizing the semiconductor thin film, the energy beam is caused to scan in a direction substantially perpendicular to the longitudinal direction of the slit.

9. A semiconductor thin film crystallization method according to claim 7, wherein
   in the step of forming the slit, the slit is formed uninterruptedly from one end of the semiconductor thin film to the other end thereof.

10. A semiconductor thin film crystallization method according to claim 7, wherein
    in the step of forming the slit, the slit is formed interruptedly.

11. A semiconductor thin film crystallization method according to claim 7, wherein
    in the step for forming the slit, a plurality of the slits are formed, spaced from each other in a direction transverse to the longitudinal direction of the slits, and
    in the step of crystallizing the semiconductor thin film, the energy beam is caused to scan, sequentially intersecting the plurality of the slits.

12. A semiconductor thin film crystallization method according to claim 1, wherein
    the step of forming the band-shaped portion for blocking crystal growth of the semiconductor thin film includes a step of etching partially the surface of the semiconductor thin film to form a band-shaped pattern of the semiconductor thin film in the surface of the semiconductor thin film, and
    in the step of crystallizing the semiconductor thin film, the energy beam is caused to scan in a direction transverse to the longitudinal direction of the band-shaped pattern.

13. A semiconductor thin film crystallization method according to claim 12, wherein
    in the step of crystallizing the semiconductor thin film, the energy beam is caused to scan in a direction substantially perpendicular to the longitudinal direction of the band-shaped pattern.

14. A semiconductor thin film crystallization method according to claim 12,
    in the step of forming the band-shaped pattern in the semiconductor thin film, the band-shaped pattern is formed uninterruptedly from one end of the semiconductor thin film to the other end thereof.

15. A semiconductor thin film crystallization method according to claim 12, wherein
    in the step of forming the band-shaped pattern, the band-shaped pattern is formed interruptedly.

16. A semiconductor thin film crystallization method according to claim 1, wherein
    the step of forming the band-shaped portion for blocking crystal growth of the semiconductor thin film includes a step of forming a band-shaped pattern of a metal film over the semiconductor thin film, and in the step of crystallizing the semiconductor thin film, the energy beam is caused to scan in a direction transverse to the longitudinal direction of the band-shaped pattern.

17. A semiconductor thin film crystallization method according to claim 16, wherein in the step of crystallizing the semiconductor thin film, the energy beam is caused to scan in a direction substantially perpendicular to the longitudinal direction of the band-shaped pattern.

18. A semiconductor thin film crystallization method according to claim 16, in the step of forming the band-shaped pattern in the semiconductor thin film, the band-shaped pattern is formed uninterruptedly from one end of the semiconductor thin film to the other end thereof.

19. A semiconductor thin film crystallization method according to claim 16, wherein in the step of forming the band-shaped pattern, the band-shaped pattern is formed interruptedly.

20. A semiconductor thin film crystallization method according to claim 1, wherein in the step of crystallizing the semiconductor thin film, the energy beam is caused to scan a plurality of items with tracks of the application region of the energy beam overlapping each other.

21. A semiconductor thin film crystallization method according to claim 1, wherein the energy beam is a laser beam excited by a semiconductor laser.

22. A semiconductor thin film crystallization method comprising the steps of:

forming a semiconductor thin film over a substrate;

forming a band-shaped portion for blocking crystal growth of the semiconductor thin film in the semiconductor film or over the semiconductor thin film; and crystallizing the semiconductor thin film by causing an energy beam of a continuous wave to scan in a direction transverse to both a longitudinal direction of the portion for blocking crystal growth, and a longitudinal length of an application region of the energy beam, to thereby crystallize the semiconductor thin film, wherein in the step of crystallizing the semiconductor thin film, the energy beam is caused to scan a plurality of times with tracks of the application region of the energy beam overlapping each other.

* * * * *